United States Patent
Ali et al.

(10) Patent No.: US 11,057,043 B2
(45) Date of Patent: Jul. 6, 2021

(54) BACKGROUND CALIBRATION OF RANDOM CHOPPING NON-IDEALITIES IN DATA CONVERTERS

(71) Applicant: Analog Devices, Inc., Norwood, MA (US)

(72) Inventors: Ahmed Mohamed Abdelatty Ali, Oak Ridge, NC (US); Bryan S. Puckett, Stokesdale, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/927,019

(22) Filed: Jul. 13, 2020

(65) Prior Publication Data

US 2020/0350921 A1  Nov. 5, 2020

Related U.S. Application Data

(63) Continuation of application No. 16/265,317, filed on Feb. 1, 2019, now Pat. No. 10,715,162.

(60) Provisional application No. 62/637,605, filed on Mar. 2, 2018.

(51) Int. Cl.
    *H03M 1/10* (2006.01)
    *H03M 1/12* (2006.01)

(52) U.S. Cl.
    CPC ....... *H03M 1/1023* (2013.01); *H03M 1/1028* (2013.01); *H03M 1/12* (2013.01)

(58) Field of Classification Search
    CPC .... H03M 1/1023; H03M 1/1028; H03M 1/12; H03M 1/1014
    USPC .......................... 341/118, 120, 131, 143, 155
    See application file for complete search history.

(56) References Cited

U.S. PATENT DOCUMENTS 7,825,839 B2 * 11/2010 Bratfisch ................ G01R 21/01
                                                         341/131
8,947,284 B2 *  2/2015 Ishii .................... H03M 1/1023
                                                         341/155

OTHER PUBLICATIONS

U.S. Appl. No. 16/265,317, filed Feb. 1, 2019, Background Calibration of Random Chopping Non-Idealities in Data Converters.

* cited by examiner

*Primary Examiner* — Khai M Nguyen
(74) *Attorney, Agent, or Firm* — Patent Capital Group

(57) ABSTRACT

Random chopping is an effective technique for data converters. Random chopping can calibrate offset errors, calibrate offset mismatch in interleaved ADCs, and dither even order harmonics. However, the non-idealities of the (analog) chopper circuit can limit its effectiveness. If left uncorrected, these non-idealities cause severe degradation in the noise floor that defeats the purpose of chopping, and the non-idealities may be substantially worse than the non-idealities that chopping is meant to fix. To address the non-idealities of the random chopper, calibration techniques can be applied, using correlators and calibrations that may already be present for the data converter. Therefore, the cost and digital overhead are negligible. Calibrating the chopper circuit can make the chopping more effective, while relaxing the design constraints imposed on the analog circuitry.

20 Claims, 11 Drawing Sheets

US 11,057,043 B2

BACKGROUND CALIBRATION OF RANDOM CHOPPING NON-IDEALITIES IN DATA CONVERTERS

PRIORITY DATA

This patent application is a continuation application of US Non-provisional patent application, Ser. No. 16/265,317 (hereinafter as the "'317 patent application"), titled "BACKGROUND CALIBRATION OF RANDOM CHOPPING NON-IDEALITIES IN DATA CONVERTERS", filed on Feb. 1, 2019, which is hereby incorporated its entirety. The '317 patent application claims priority to and receives benefit of U.S. Provisional Patent Application, Ser. No. 62/637,605, titled "BACKGROUND CALIBRATION OF RANDOM CHOPPING NON-IDEALITIES IN DATA CONVERTERS", filed on Mar. 2, 2018, which is hereby incorporated in its entirety.

TECHNICAL FIELD OF THE DISCLOSURE

The present disclosure relates to the field of integrated circuits, in particular to background calibration of choppers, such as choppers in data converters.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Random chopping is an effective technique for data converters. Random chopping can calibrate offset errors, calibrate offset mismatch in interleaved ADCs, and dither even order harmonics. However, the non-idealities of the (analog) chopper circuit can limit its effectiveness. If left uncorrected, these non-idealities cause severe degradation in the noise floor that defeats the purpose of chopping, and the non-idealities may be substantially worse than the non-idealities that chopping is meant to fix. To address the non-idealities of the random chopper, calibration techniques can be applied, using correlators and calibrations that may already be present for the data converter. Therefore, the cost and digital overhead are negligible. Calibrating the chopper circuit can make the chopping more effective, while relaxing the design constraints imposed on the analog circuitry.

Random Chopping, or Chopping in General

Random chopping is a technique for randomly changing the polarity of a signal or a differential signal path. It can be seen as a multiplicative dither having randomly changing values of +1 or −1. Random chopping can be used to correct for offset and low frequency errors, offset mismatch in interleaved ADCs, and to dither even order harmonics. Chopping, more broadly, can be used to code modulate the input signals, e.g., in order to multiplex multiple inputs on the same ADC. While the application refers to examples where random choppers are used, the embodiments for calibrating the random chopper can be applied to choppers in general, where a chopper changes the polarity of a signal or differential signal path according to a code sequence.

Figure 1:
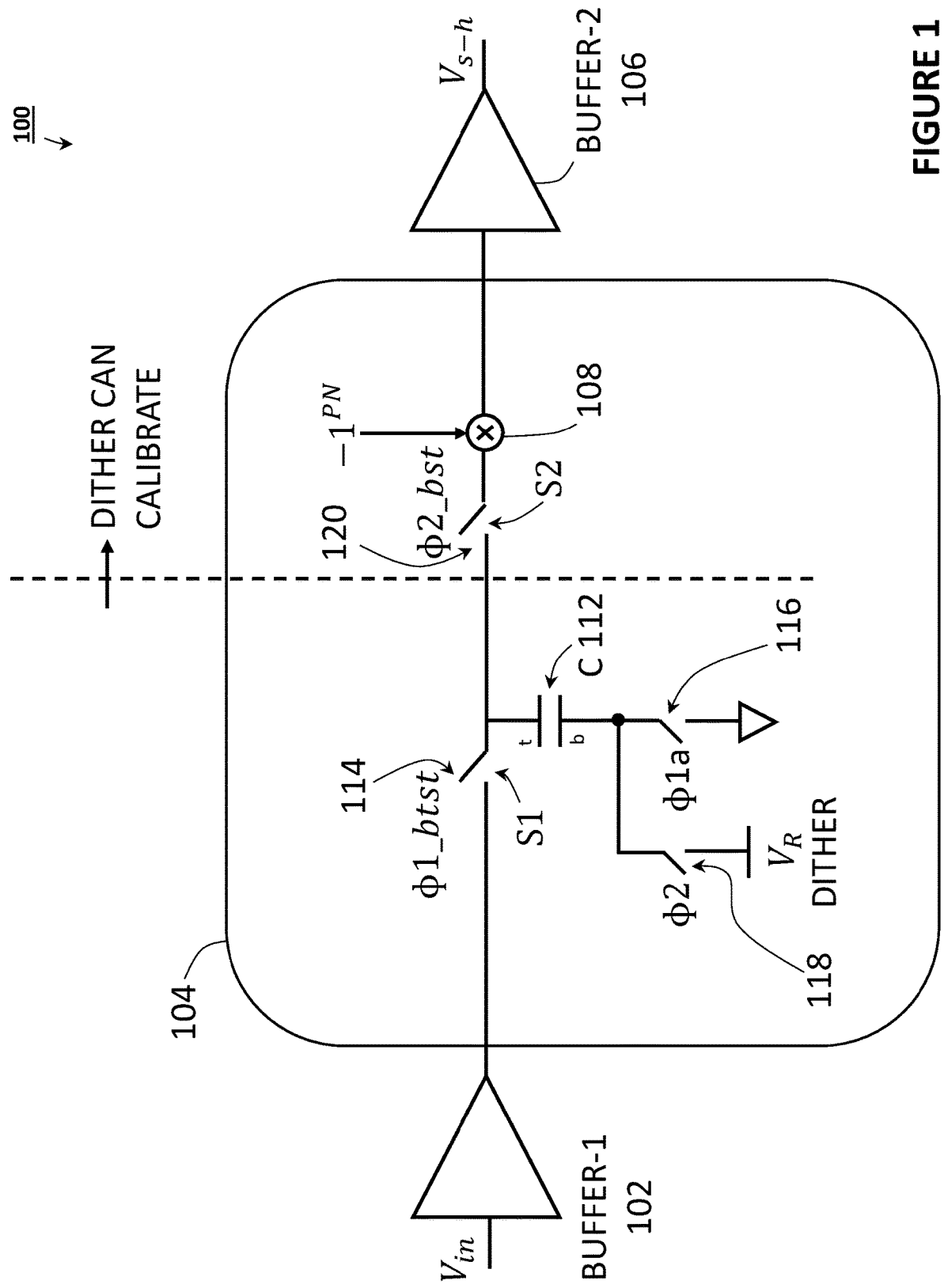
FIG. 1 shows an example of a random chopper in an input path.
Figure 2:
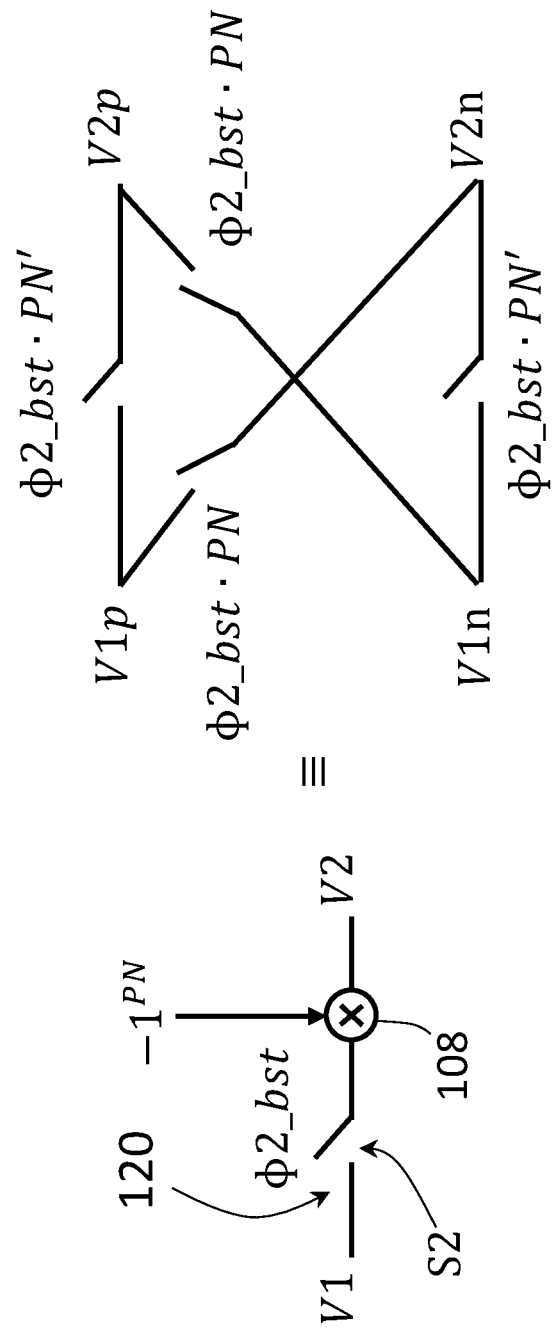
FIG. 2 shows an exemplary circuit implementation of a random chopper.
Figure 3:
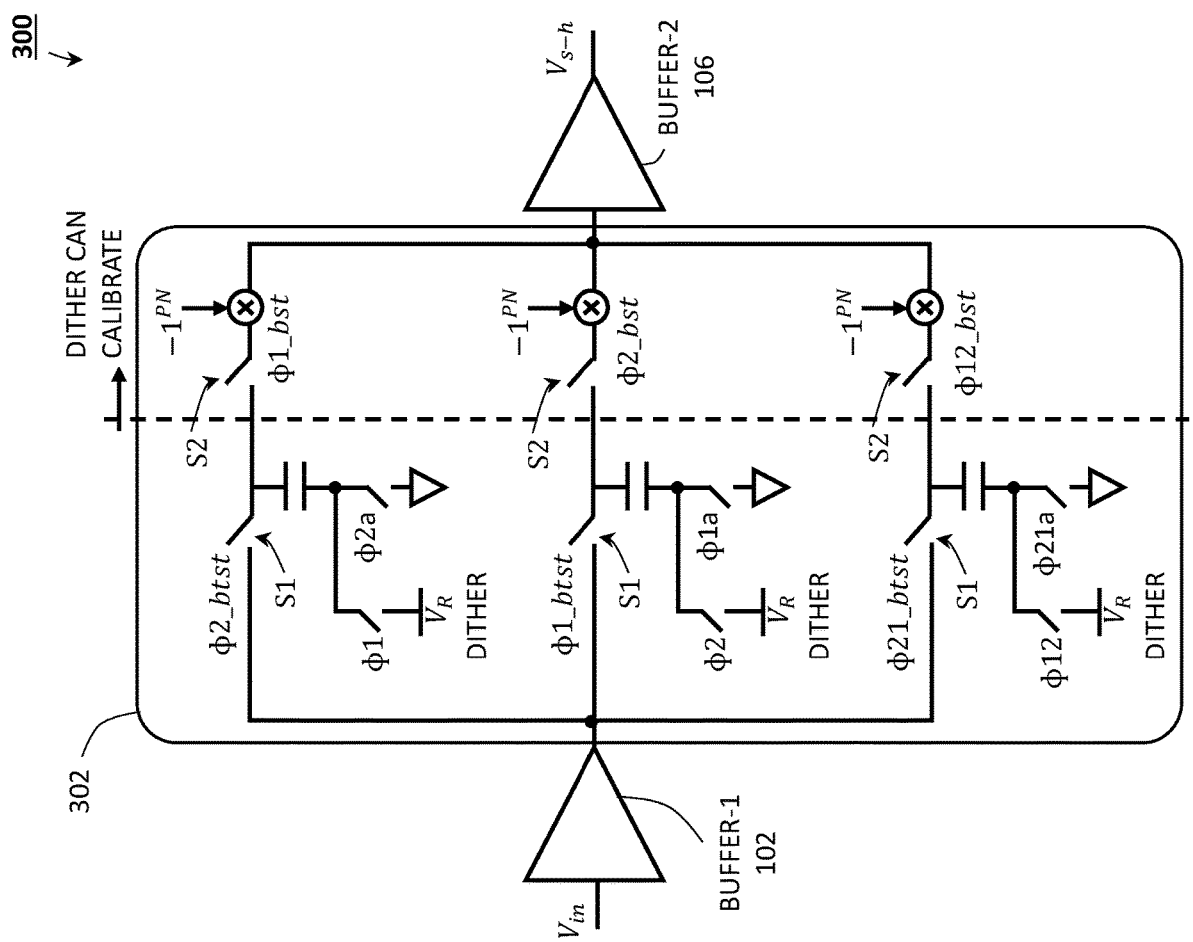
FIG. 3 shows an example of random choppers in parallel sampling networks of an input path.

In some cases, random chopping can be employed in the input signal path, where chopping involves randomly swapping the two sides of a differential signal, such as a differential analog input signal. FIGS. 1-3 illustrate some examples of random chopping in an input signal path. It is envisioned by the disclosure that random chopping can be implemented in other differential circuits that are not explicitly shown in the FIGURES. Circuitry that implements random chopping is referred herein as a random chopper.

FIG. 1 shows an example of a random chopper in an input path. The input path in this example is a track and hold (T/H) circuit 100 having two buffers, Buffer-1 102, and Buffer-2 106, and a switched-capacitor network 104 in between the two buffers. The Buffer-1 102 receives the (voltage) input $V_{in}$, and buffers the input. The Buffer-2 106 can buffer the sampled input in the switched-capacitor network 104 and provide the held signal $V_{s-h}$ to an ADC (not shown in FIG. 1). The T/H circuit 100 can be seen as an open loop T/H circuit. Buffer-1 102 can be a sampling buffer, and Buffer-2 106 can be a hold buffer. The buffers are optional, and can be included to provide isolation between different circuit stages.

The switched-capacitor network 104 can be a sampling network. In this example shown, the switched-capacitor network 104 includes capacitor C 112, input switch 114 (labeled S2), output switch 120 (labeled S2), bottom plate sampling switch 116, and dither injection switch 118. Additive dither (provided at node $V_R$) can be injected in the switched-capacitor network 104, and the additive dither can be used to calibrate the Buffer-2 106 and the ADC following the T/H circuit 100. The implementation of the switched-capacitor network 104 is only an example of a switched-capacitor network, and is not meant to be limiting to the disclosure. It is envisioned by the disclosure that other suitable circuits can be implemented to sample a signal and inject an additive dither. For instance, the switched-capacitor network 104 can implement inverted sampling. In another instance, a separate dither capacitor can be used to inject the additive dither into the switched-capacitor network 104.

Moreover, the switched-capacitor network 104 includes a random chopper 108. In addition to injecting additive dither, the T/H circuit 100 (random chopper 108 specifically) can randomly chop the input signal by randomly changing polarities based on a pseudo-random code "PN". The pseudo-random code PN can have sequence of randomized values of 0 and 1. In some embodiments, the T/H circuit 100 can inject a multiplicative dither, using the random chopper 108, where the multiplicative dither can be a +1 or −1, as chosen by the code PN. Effectively, the random chopper 108 can multiply the signal in the signal path randomly by $-1^{PN=0}=+1$ or $-1^{PN=1}=-1$. The code PN can dictate/define the state of the random chopper 108, which can be represented by a bit PN (its negated version is represented as PN'). Specifically, when PN=0, the polarity is unchanged. When PN=1, the polarity is changed. A random chopper 108 performing a random chopping function can be integrated with a switch in the switched-capacitor network 104, such as the input switch S1, or the output switch S2 (as illustrated in FIG. 1). The latter has the advantage of being able to use the additive dither injected upstream to calibrate the random chopping function integrated with the output switch S2.

FIG. 2 shows an exemplary circuit implementation of a random chopper integrated with a switch. For this exemplary random chopper, the random chopper is integrated with output switch S2. Mathematically, the signal is multiplied with a dither value represented by $-1^{PN}$ by random chopper 108, where PN is a pseudo-random code dictating the state of the random chopper. For illustration, on the left hand side of FIG. 2, an output switch S2 associated with phase φ2_bst is shown, followed with a random chopping function represented by random chopper 108. This random chopping function can be achieved in a differential circuit implementation seen on the right hand side of FIG. 2. In a differential circuit, the node V1 on the left hand side of the FIG. 2 is represented by differential nodes V1p and V1n respectively on the right hand side of the FIG. 2. The node V2 on the left hand side of the FIG. 2 is represented by differential nodes V2p and V2n respectively on the right hand side of the FIG. 2. The circuit has straight forward paths and crisscross paths. The switches in these paths enables random switching between the straight forward paths and crisscross paths, based on the value/state of PN. In other words, the multiplicative dither can randomly swap positive and negative input paths. The straight forward paths with switches associated with φ2_bst*PN', are closed when PN=0, and PN'=1. The switches, when closed, allows the differential signal at nodes V1p and V1n to pass straight through to nodes V2p and V2n respectively, without changing the polarity of the differential signal. This means that the multiplicative dither value being applied in this case was $-1^{PN=0}=+1$. The crisscross paths with switches associated with φ2_bst*PN are closed when PN=1, and PN'=0. The switches, when closed, invert the differential signal at nodes V1p and V1n and pass the differential signal to nodes V2n and V2p respectively, changing the polarity of the differential signal. This means that the multiplicative dither value being applied in this case was $-1^{PN=1}=-1$.

FIG. 3 shows an example of random choppers in parallel sampling networks of an input path. Specifically, the input path is a T/H circuit 300 with multiple time-interleaved sampling networks 302 with chopping added to each sampling network to inject a multiplicative dither. For this particular example shown, multiple time-interleaved sampling networks 302 includes three sampling networks. Each one of the sampling network has integrated additive dither injection and random chopping function, similar to the single switched-capacitor network 104 of FIG. 1. Referring back to FIG. 3, two sampling networks within the multiple time-interleaved sampling networks 302 can be randomly selected to be the next sampling network to sample the input to randomize mismatch errors between the sampling networks. The random chopping functions 304, 306, and 308, are integrated with the output switches labeled S2 associated with phases φ1_bst, φ2_bst, and φ12_bst, respectively. In the alternative, the random chopping functions 304, 306, and 308, can be integrated with the input switches labeled S1 associated with φ1_btst, φ2_btst, and φ12_btst. The former has the additional advantage that the random chopper can be calibrated by the additive dither, if desired.

By randomly swapping the positive and negative input paths, the DC (direct current) component of the input signal can be randomized, making it easier to calibrate for any offset mismatches between the different slices. The random chopping function can be implemented with the input switch of a switched-capacitor network sampling a signal, which can randomly invert the signal in the sampling phase. The chopping function can be implemented with the output switch of a switched-capacitor network sampling a signal, which can randomly invert the signal in the hold phase. Moreover, random chopping can be useful for offset mismatch calibration, where the random chopping function can convert any input offset and/or signals at problematic frequencies (such as $f_s/M$, and $f_s/2M$, where M is the number of slices) into noise, e.g., so as to not impact the offset convergence and removal of the offset. Random chopping can also help with even order distortions or to reduce even order harmonics in the signal path. It is understood that while the random chopping function can be integrated with a switch that is in the sampling network, it is possible to include random chopping function at any point in the signal path.

Note that in the examples shown in FIGS. 1 and 3, additive dither (injected at node $V_R$ having dither value $V_d$) can be injected in a switched-capacitor network. In some preferred embodiments, the additive dither is injected before the chopper in the sampling network in order to correct for gain errors and non-linearity downstream from where the dither is injected.

Removing Dithers in the Digital Domain

Figure 4:
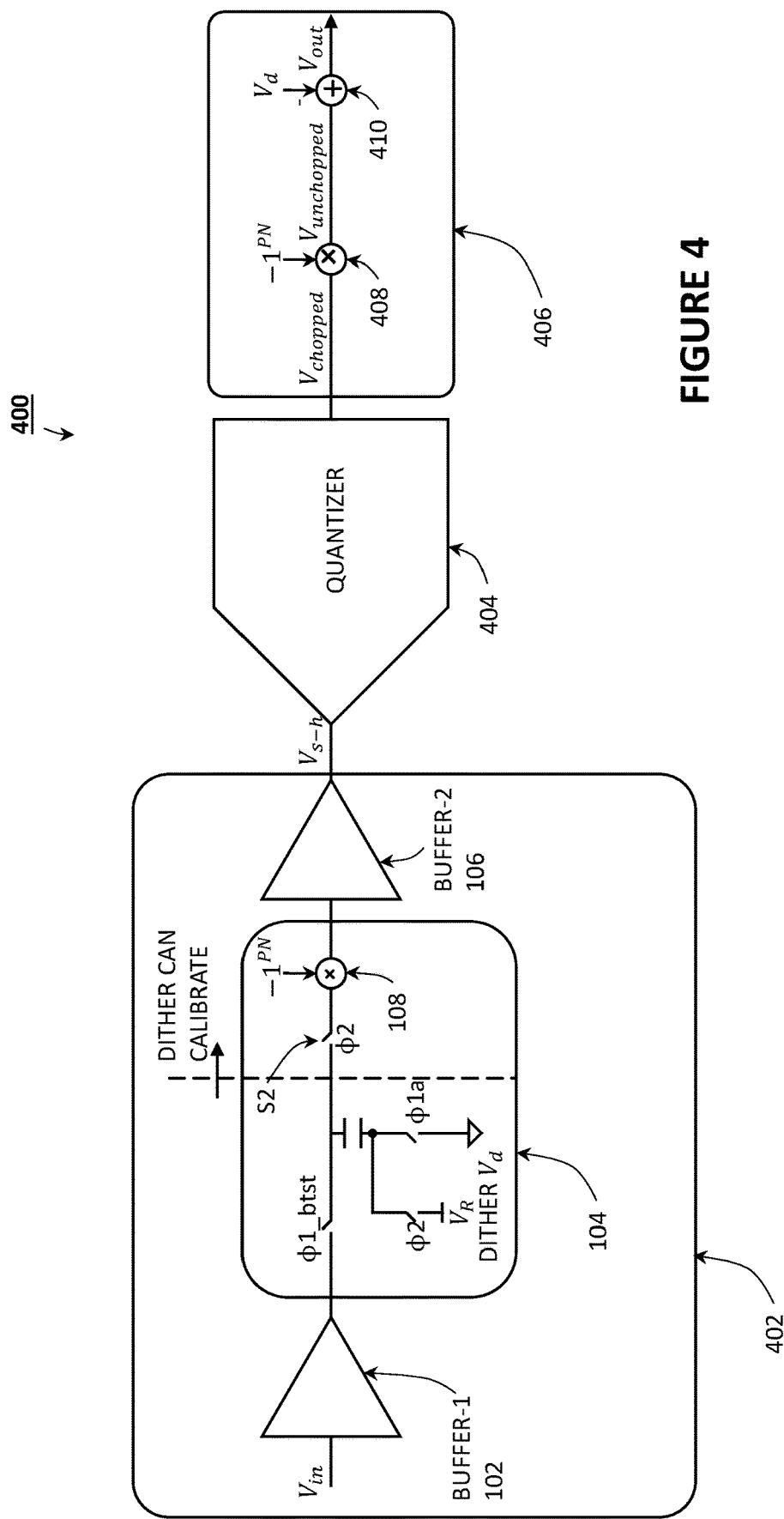
FIG. 4 illustrates (1) dither injection and random chopping in the analog input path, and (2) removal of the injected dither and unchopping of the signal in the digital output path, according to some embodiments of the disclosure.

The same random chopping can then be reapplied on the digital side, e.g., after offset calibration to restore the original signal. FIG. 4 illustrates (1) dither injection and random chopping in the analog input path, and (2) removal of the injected dither and unchopping of the signal in the digital output path, according to some embodiments of the disclosure. The overall signal path 400 includes an input path 402, which can be implemented using exemplary circuitry shown in FIGS. 1 and 3. In the input path 402, dither is be injected followed by a random chopping function (e.g., random chopper 108) within the sampling network. The output of the input path 402 $V_{s-h}$ can then be digitized by quantizer 404 into a digital signal represented by $V_{chopped}$.

In the digital domain, the output $V_{chopped}$ from quantizer 404 is "unchopped" to obtain an unchopped signal $V_{unchopped}$. Circuitry that implements unchopping is referred herein as an unchopper. The output path 406 includes unchopper 408 that changes the polarity of the output $V_{chopped}$, i.e., using the same PN code that is used for the random chopper in the input path 402, which can effectively reverse any change in polarity done in the input path 402 by the random chopper (e.g., random chopper 108) in the input path 402. The PN code, same as before, can have sequence of randomized values of 0 and 1. The unchopper 408 injects a multiplicative dither, which can be 1 or −1, as chosen by the code PN. Effectively, the unchopper 408 can multiply the signal $V_{chopped}$ in the signal path randomly by $-1^{PN=0}=+1$ or $-1^{PN=1}=1$.

In the digital domain, the output path 406 also includes a summer 410 which can remove the injected dither by subtracting the dither value $V_d$ (representing or estimating the value of the dither injected in the input path 402, such as at node $V_R$) from the unchopped signal $V_{unchopped}$ to obtain the original signal $V_{out}$.

The ideal chopping function can be defined as follows:

$$f_c(V_{in}) = (-1)^{PN} \cdot V_{in} \quad (1)$$

where PN is a pseudo-random digital code that is randomly switching between 0 and 1, dictating the state of the random chopper. As shown above, the chopping function is mathematically represented as a multiplication, where a signal $V_{in}$ is multiplied by $(-1)^{PN}$.

Non-Idealities in Chopping

Unfortunately, non-idealities in the chopping can result in rise in the noise floor, errors in calibration, errors in removing additive dither, cross-talk, and other issues. It is advantageous to remove the non-idealities in the chopping process that can impact the overall performance. The main source of non-idealities are offset and gain errors in the random chopping process. Non-linear errors can also be present, but their impact is much smaller than the offset and gain errors.

Addressing the Non-Idealities Through a Least Mean Squares Algorithm

The following passages describe some schemes that utilize a least mean squares (LMS) algorithm to extract and correct the non-idealities, and some schemes that utilize the dither injected before the random chopper in the input path to expose the chopping non-idealities and an LMS algorithm to extract and correct the non-idealities. Broadly speaking, a corrected signal generated by an estimated correction term is used to derive an error term, and then an LMS algorithm can update the correction term based on the error term. Over many updates of the LMS algorithm, correction term converges to a "right value" which would reduce the error exposed by the error term in the LMS equation. In some cases, it is a digital adaptive filter that aims to find or adapt to the "right value" for the correction term that can best correct for the error of interest.

The error term definition in various LMS equations can differ depending on the non-ideality of interest. The formulation for the error term can be designed to expose an error caused by the non-ideality of interest. Designing specific definitions for the error term is not trivial. Generally speaking, the error term would include the correction term and the signal of interest. In other words, the error term can include a corrected signal of interest, then the formulation extracts an error based on the corrected signal of interest. The corrected signal of interest can be captured by the correction term being applied to a sample of output data. The output data can be a digital representation of the signal of interest (where the signal of interest is usually a signal downstream from the chopper). In some cases, the error term is defined based on a quantity that is expected to be zero when the correction term converges to the right value. In some cases, the error term is defined based on a quantity that is expected to be zero on average or over time in mean. For example, the quantity can represent two signals that are expected to not be correlated with each other, and their cross-correlation would be zero over many samples when the correction term converges to the right value.

The error term can be formulated in a variety of ways to expose the error caused by a given non-ideality of interest. Preferably, the error term is formulated in a way that can be computed efficiently. Computing the error term typically includes observing (corrected) output data (signal downstream from the chopper, which is subsequently digitized) and optionally the state of the chopper. The error term can be defined to observe the error, a sample of the output data at a time. The error term can be defined to observe the error based on a block of the output data collected over a period of time (e.g., cumulative histogram or count).

A correction equation, can be formulated based on the correction term to remove the error caused by the non-ideality of interest. The correction equation would depend on how the error term and the correction term are defined. A digital correction scheme implementing the correction equation can be used to generate a corrected signal based on the uncorrected signal and the correction term.

A corrected signal and an updated estimated correction term can be used again in a closed loop to determine the error term in the next iteration of the algorithm. As the LMS algorithm runs, the correction term converges to a value that can minimize or reduce the error term.

Some of these schemes can use chopping state dependent correlations as part of the error term extraction process.

Some schemes can use counting or histograms as part of the error term extraction process.

It is envisioned by the disclosure that that different kinds of LMS algorithms or adaptive filtering schemes can be used, as long as they can be implemented in a closed loop to converge to a correction term that can reduce the error or drive the error to zero.

As discussed previously, the chopper can have two states. In some cases, the non-ideality of interest is dependent on the state of the chopper. This means that the correction term to be applied to reduce the error introduced by the non-ideality of interest can be different depending on the state of the chopper. Accordingly, one correction term is determined and applied for one state of the chopper, and another correction term is determined and applied for another state of the chopper. Also, this means that the error term is to be extracted separately/independently. One way to extract the error term and determine the correction term separately/independently for the two chopping states is to apply binning or gating to the output data being used in the LMS equations. When updating a correction term corresponding to a first state of the chopper, only output data corresponding to the first state of the chopper is used in computing the error term corresponding to the first state of the chopper. When updating a correction term corresponding to a second state of the chopper, only output data corresponding to the second state of the chopper is used in computing the error term corresponding to the second state of the chopper. The state of the chopper can be applied to LMS equations in a way to ensure that output data associated with a particular state of the chopper is binned/gated. For example, the state of the chopper (e.g., represented by a bit having a value of "1" or "0"), if applied appropriately in an LMS equation, can cause the correction term associated with a particular state of the chopper to be updated when the output data used in determining the error term is associated with the particular state of the chopper, and cause the correction term associated with the particular state of the chopper to remain the same (e.g., no update) when the output data used in determining the error term is not associated with the particular state of the chopper.

Chopping Offset Errors

The offset chopping error can be represented as part of the following chopping function:

$$f_{c\_off}(V_{in}) = -1^{PN} \cdot V_{in} + V_{off1} \cdot PN + V_{off2} \cdot PN' \quad (2)$$

where $V_{off1}$, $V_{off2}$ represent the offset errors in the two chopping states respectively, and PN is the chopping pseudo-random digital code or state that randomly switches between: 0 and 1. The two chopping states include a first state PN, which is when PN is 1 (PN' is 0) and polarity is changed, and a second state, which is when PN is 0 (PN' is 1) and polarity is unchanged. In other words, the two chopping states include a first state PN=1 when the polarity of the signal $V_{in}$ is flipped (signal is passed through crisscross paths), and a second state PN'=1 when the polarity of the signal $V_{in}$ is unchanged (signal is passed through straight forward paths). The error terms for the offset errors corresponding to respective chopping states are: $V_{off1} \cdot PN$ and $V_{off2} \cdot PN'$. When the chopper is in the first state, PN is 1, and a first offset error $V_{off1}$ is introduced (because PN is true or 1 and the PN' is false or 0). When the chopper is in the second state PN', PN is 0, and a second offset error $V_{off2}$ is introduced (because the PN is false or 0 and PN' is true or 1).

The effect of this chopping-dependent offset is different from a direct current (DC) input or offset before chopping. Any offset before chopping would be chopped to give a zero mean output after chopping. When unchopped, the DC input can be reconstructed back as a DC output. This is represented as:

$$f_c(V_{in}+V_{DC}) = -1^{PN} \cdot (V_{in}+V_{DC}) = -1^{PN} \cdot V_{in} + -1^{PN} \cdot V_{DC} \quad (3)$$

Comparing equations (2) and (3), it is can be seen that that DC input $V_{DC}$ and offset associated with the two chopping states have different effects on the signal. While a DC input (or any offset before chopping) can be reconstructed at the output after unchopping, an offset error caused the chopping process as represented by equation (2) would result in noise at the output if left as is or uncorrected. In other words, the two cases are different:

$$f_c(V_{in}+V_{DC}) \neq f_{c\_off}(V_{in}) \quad (4)$$

Equation (2) can be rewritten to be in the form:

$$f_{c\_off}(V_{in}) = -1^{PN} \cdot V_{in} + \frac{V_{off1}+V_{off2}}{2} + -1^{PN} \cdot \left(\frac{V_{off2}-V_{off1}}{2}\right) \quad (5)$$

Equation (5) illustrates the effect of the chopping offset mismatch. The effect is to generate an offset in the chopped signal equal to the average of the two offsets $$\left(\frac{V_{off1}+V_{off2}}{2}\right),$$

and another components $$\left(-1^{PN} \cdot \left(\frac{V_{off1}+V_{off2}}{2}\right)\right)$$

that behaves like a DC input. The average component $V_{off1}+V_{off2}/2$ introduced by the chopping offset mismatch can be removed before unchopping, or else the average component can be transformed into noise when the signal is unchopped (which can degrade the signal path).

Figure 5:
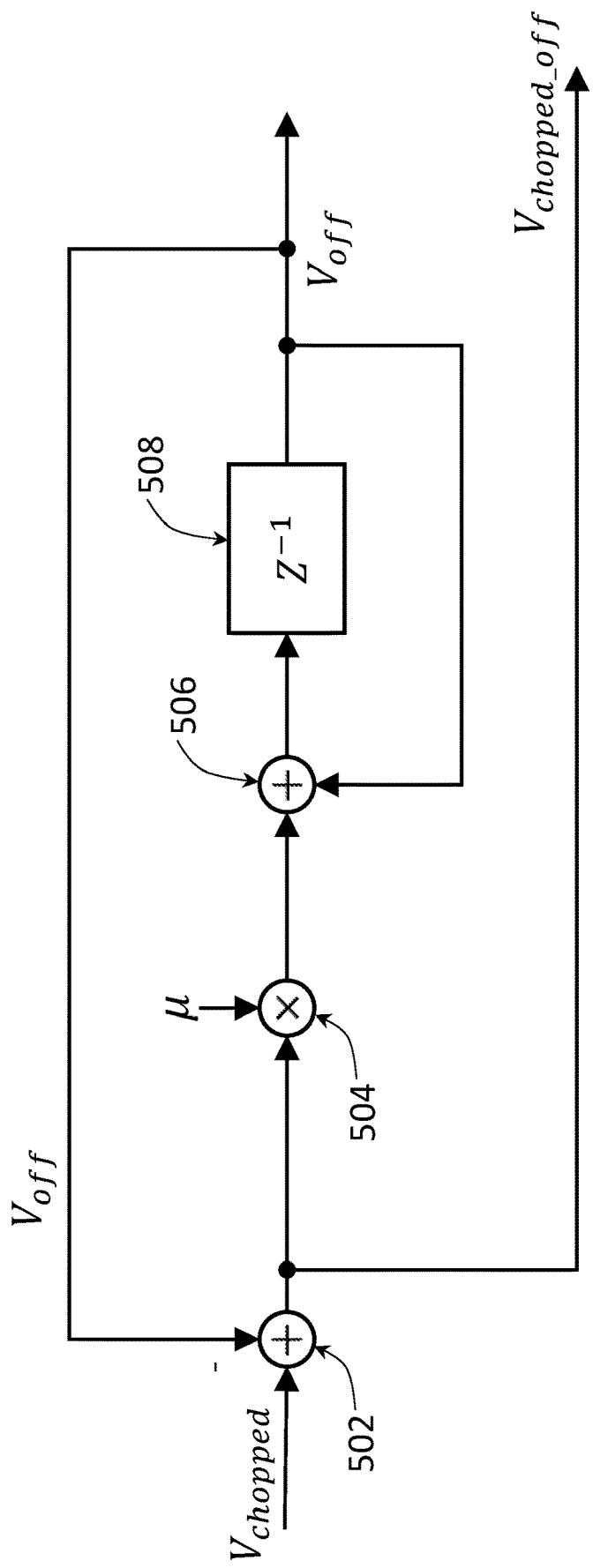
FIG. 5 illustrates an exemplary scheme for removing the offset error, according to some embodiments of the disclosure.

FIG. 5 illustrates an exemplary scheme for removing of the offset error, according to some embodiments of the disclosure. The offset error $V_{off}[n]$ caused by the chopping process can be removed by an offset cancellation circuitry operating on the chopped signal $V_{chopped}$. Any offset before unchopping can translate into noise after unchopping. The offset cancellation circuitry performs the following operation (i.e., LMS update equation) to obtain and update correction term $V_{off}[n]$:

$$V_{off}[n+1] = V_{off}[n] + \mu \cdot (V_{chopped}[n] - V_{off}[n]) \quad (6)$$

Equation 6 represents an LMS update equation which can update the estimated offset correction term $V_{off}[n]$ based on a convergence/update coefficient $\mu$ and error term ($V_{chopped}[n] - V_{off}[n]$). The error term represents the DC/offset error in the chopped signal, which is to be removed. The calculation of the error term $V_{chopped}[n] - V_{off}[n]$ can be performed by summation node 502 which subtracts $V_{chopped}[n]$ by $V_{off}[n]$. $\mu \cdot (V_{chopped}[n] - V_{off}[n])$ can be performed by multiplier 504, which multiplies $V_{chopped}[n] - V_{off}[n]$ by convergence coefficient $\mu$. $V_{off}[n] + \mu \cdot (V_{chopped}[n] - V_{off}[n])$ can be performed by summation node 506, which adds $\mu \cdot (V_{chopped}[n] - V_{off}[n])$ and $V_{off}[n]$. The final result $V_{off}[n] + \mu \cdot (V_{chopped}[n] - V_{off}[n])$ is delayed by delay block 508 to form an updated $V_{off}[n+1]$.

The offset-corrected chopped output is given by:

$$V_{chopped\_off}[n] = V_{chopped}[n] - V_{off}[n] \quad (7)$$

The offset-corrected chopped output $V_{chopped\_off}[n]$ can be obtained by subtracting $V_{off}[n]$ from $V_{chopped}[n]$ by the summation node 502.

The unchopped signal is given by:

$$V_{unchopped}[n] = V_{in} + \frac{V_{off2} + V_{off1}}{2} \quad (8)$$

Therefore, this results in an overall input-referred offset that can be easily removed or trimmed. By removing the DC/offset error, the unchopping no longer creates noise in the unchopped signal. Furthermore, the offset correction does not require any additional processing, as some form of offset cancellation in the chopped domain may need to be done anyway. In fact, offset correction after chopping is one of the main reasons for using random chopping in the first place.

Various calibration schemes described herein can be examples of digitally assisted analog techniques. In particular, the analog circuit of interest has a chopper. By applying appropriate schemes to observe the chopped digital signal in the digital domain, it is possible to extract and correct for non-idealities of the chopper in the digital domain. The advantage of applying such techniques is that the design requirements on the analog circuit can be relaxed.

Chopping Gain Errors

Additionally, the random chopper may have a chopping gain error that can be represented as:

$$f_c(V_{in}) = (-(1+\alpha_c))^{PN} \cdot V_{in} = -1^{PN} \cdot V_{in} \cdot (1+PN \cdot \alpha_c) \quad (9)$$

In the above equation, the code PN is either 0 or 1. The presence of gain error means that the ideal gain of the random chopper is no longer exactly 1. As seen in the above equation, the gain error can introduces a multiplicative term $(1+PN \cdot \alpha_c)$ to the ideal result of a chopped signal, which was $-1^{PN} \cdot V_{in}$. The chopping gain error can be more serious or more detrimental to the signal path than the chopping offset error. Furthermore, the gain can be different depending on the state of the random chopper. The estimation of the gain non-ideality $\alpha_c[n]$ (correction term that can be used to correct for the gain non-ideality) can be done by correlating the pre-chopping dither $V_d[n]$ with the chopped signal with the post-chopping dither removed $(V_{chopped}[n] - f_c(V_d[n]))$ and using the LMS equation as follows:

$$\alpha_c[n+1] = \alpha_c[n] - \mu \cdot V_d[n] \cdot (V_{chopped}[n] - f_c(V_d[n])) \quad (10)$$

where $V_d$ is the (additive) dither injected before the chopping. In this example, the error term can be considered as $V_d[n] \cdot (V \text{ chopped}[n] - f_c(V_d[n]))$. As the LMS algorithm runs, when the correction term $\alpha_c[n]$ converges to the right value, the pre-chopping dither $V_d[n]$ is expected to be uncorrelated with the chopped signal with the post-chopping dither removed $(V_{chopped}[n] - f_c(V_d[n]))$. The post-chopping dither can be an estimate of a chopped additive dither (in other words, the additive dither has gone through the chopper).

Gain error is dependent on chopping state. In other words, the gain can be different depending on the chopping state. The error extraction and correction can be done using different approaches. In one approach, different gain error terms are determined separately for each chopping state. In this approach, data associated with a first chopping state is used for updating the gain correction term for the first chopping state, and data associated with a second chopping state is used for updating the gain error term for the second chopping state. In other words, the data associated with different chopping states are binned by the chopping state when state dependent gain error terms are updated/computed. When correcting for gain error, different correction terms can be applied depending on the chopping state. In another approach, the gain of a first chopping state is assumed to be unity or equals to 1, and the gain error of a second chopping state is assumed to be relative to the first chopping state. When correcting for gain error, an overall gain estimate can be determined (which addresses both chopping states), and a gain correction term associated with the second chopping state (representing gain relative to the first chopping state) can be used to correct the relative gain error between the two chopping states. In this approach, data associated with the second chopping state (not the data associated with the first chopping state) is used for updating the gain correction term for the second chopping state. In other words, the chopping state is gating the data being used for updating the gain correction term of for the second chopping state.

Figure 6:
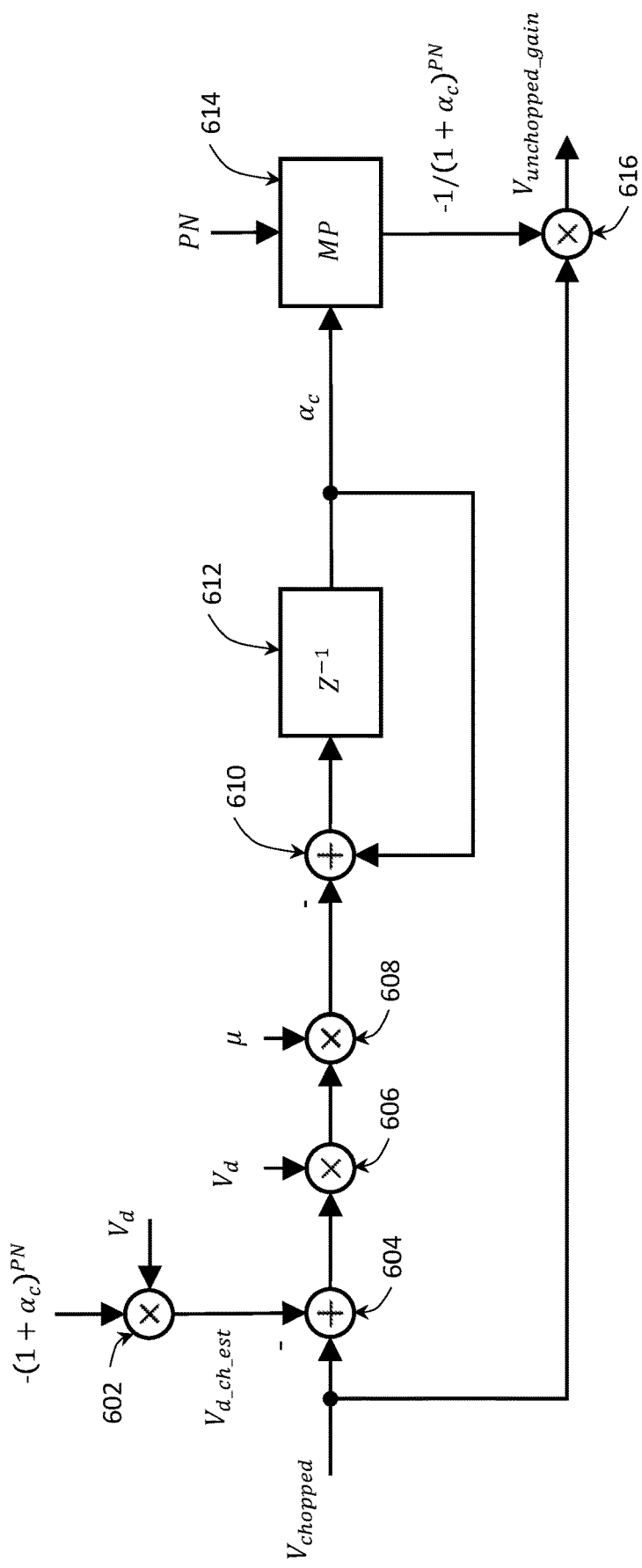
FIG. 6 illustrates an exemplary scheme for removing the gain error, according to some embodiments of the disclosure.

FIG. 6 illustrates an exemplary scheme for removing the gain error, according to some embodiments of the disclosure. The gain error caused by the chopping process can be removed by gain cancellation circuitry operating on the chopped signal $V_{chopped}$. First, the post-chopping dither $f_c(V_d[n])$ can be represented as follows:

$$f_c(V_d[n]) = (-(1+\alpha_c[n]))^{PN[n]} \cdot V_d[n] \quad (11)$$

The post-chopping dither $f_c(V_d[n])$ is obtained by multiplier 602, which multiplies the pre-chopping dither $V_d[n]$ and $(-(1+\alpha_c[n]))^{PN[n]}$. The post-chopping dither is shown as $V_{d\_ch\_est}$ in FIG. 6. Summation node 604 performs $(V_{chopped}[n] - f_c(V_d[n]))$ by subtracting the chopped signal $V_{chopped}[n]$ by post-chopping dither $(-(1+\alpha_c[n]))^{PN[n]} \cdot V_d[n]$. Then, multiplier 606 performs the correlation, i.e., $V_d[n] \cdot (V_{chopped}[n] - f_c(V_d[n]))$, by multiplying $(V_{chopped}[n] - f_c(V_d[n]))$ and $V_d[n]$. Multiplier 608 obtains, $\mu \cdot V_d[n] \cdot (V_{chopped}[n] - f_c(V_d[n]))$, by multiplying $\mu$ and $V_d[n] \cdot (V_{chopped}[n] - f_c(V_d[n]))$. Summation node 610 performs $\alpha_c[n] - \mu \cdot V_d[n] \cdot (V_{chopped}[n] - f_c(V_d[n]))$ by adding $-\mu \cdot V_d[n] \cdot (V_{chopped}[n] - f_c(V_d[n]))$ and $\alpha_c[n]$. The result of summation node 610 is delayed through delay block 612 to form an updated correction term $\alpha_c[n+1]$. This LMS correlation operation is performed before the unchopping, i.e., on $V_{chopped}[n]$. The converged/converging value of $\alpha_c$ used to correct the output. In other words, the converged/converging value of $\alpha_c$ is applied on the chopped signal $V_{chopped}[n]$ to obtain a gain error corrected and unchopped signal $V_{unchopped\_gain}[n]$. That is:

$$V_{unchopped\_gain}[n] = (-1/(1+\alpha_c))^{PN[n]} \cdot V_{chopped}[n] \quad (12)$$

The operation for obtaining the unchopped signal with the gain error removed $V_{unchopped\_gain}[n]$ is performed by block 614 and multiplier 616. Block 614 takes PN[n] and converged/converging value of $\alpha_c$ as inputs and calculates multiplicative factor $(-1/(1+\alpha_c))^{PN[n]}$. Finally, multiplier 616 multiplies $V_{chopped}[n]$ and multiplicative factor $(-1/(1+\alpha_c))^{PN[n]}$ to obtain the unchopped signal $V_{unchopped\_gain}[n]$. The multiplicative factors used in obtaining $V_{unchopped\_gain}[n]$, i.e., $(-1/(1+\alpha_c))^{PN[n]}$, unchops the signal and accounts for the gain error at the same time. Note that when PN=0, block 614 computes $(-1/(1+\alpha_c))^0 = 1$ as the multiplicative factor, and when PN=1, block 614 computes $(-1/(1+\alpha_c))^1 = -1/(1+\alpha_c)$ as the multiplicative factor. Accordingly, the gain cancellation circuitry seen in FIG. 6 undos the chopping in approximately the same way it was applied, and correct for gain error in the chopping process.

Alternatives exists to LMS equation (10), including the following:

$$\alpha_c[n+1] = \alpha_c[n] - \mu \cdot V_{dc}[n] \cdot PN[n] \cdot (V_{chopped}[n] + \alpha_c[n] \cdot V_{dc}[n]) \quad (13)$$

Note that the above formulates the error term as follows: $V_{dc}[n] \cdot PN[n] \cdot (V_{chopped}[n] + \alpha_c[n] \cdot V_{dc}[n])$. The error term in equation 13 is correlating the post-chopping dither $V_{dc}[n] = V_d[n] \cdot -1^{PN}$ against a quantity, e.g., $PN[n] \cdot (V_{chopped}[n] + \alpha_c[n] \cdot V_{dc}[n])$, that is expected to be uncorrelated with the post-chopping dither $V_{dc}[n]$ once the correction term $\alpha_c[n]$ converges to a value that best reduces the chopping gain error.

In some cases, such as equation (13), PN[n] is included to enable binning based on the chopping state. This means that the LMS equation updates when PN[n]=1, and the LMS equation does not update when PN[n]=0 (because the error term would equal to 0). Using equation (13), it is thus possible to find the gain correction term associated with the chopping state where PN[n]=1 since only data associated with PN[n]=1 is used to update the correction term. When used alone, Equation (13) can be used to determine the correction term of the chopping state where PN[n]=1 that is relative to the chopping state where PN[n]=0, while assuming that the gain associated with the chopping state where PN[n]=0 is unity or equals to 1.

As discussed previously, there are two chopping states: (1) PN=1, PN'=0, and (2) PN'=1, and PN=0. Using the post-chopping dither ensures that the polarity for the dither value is the same when PN=0, and that the polarity of the dither value is flipped (or reverse sign) when PN=1.

Figure 7:
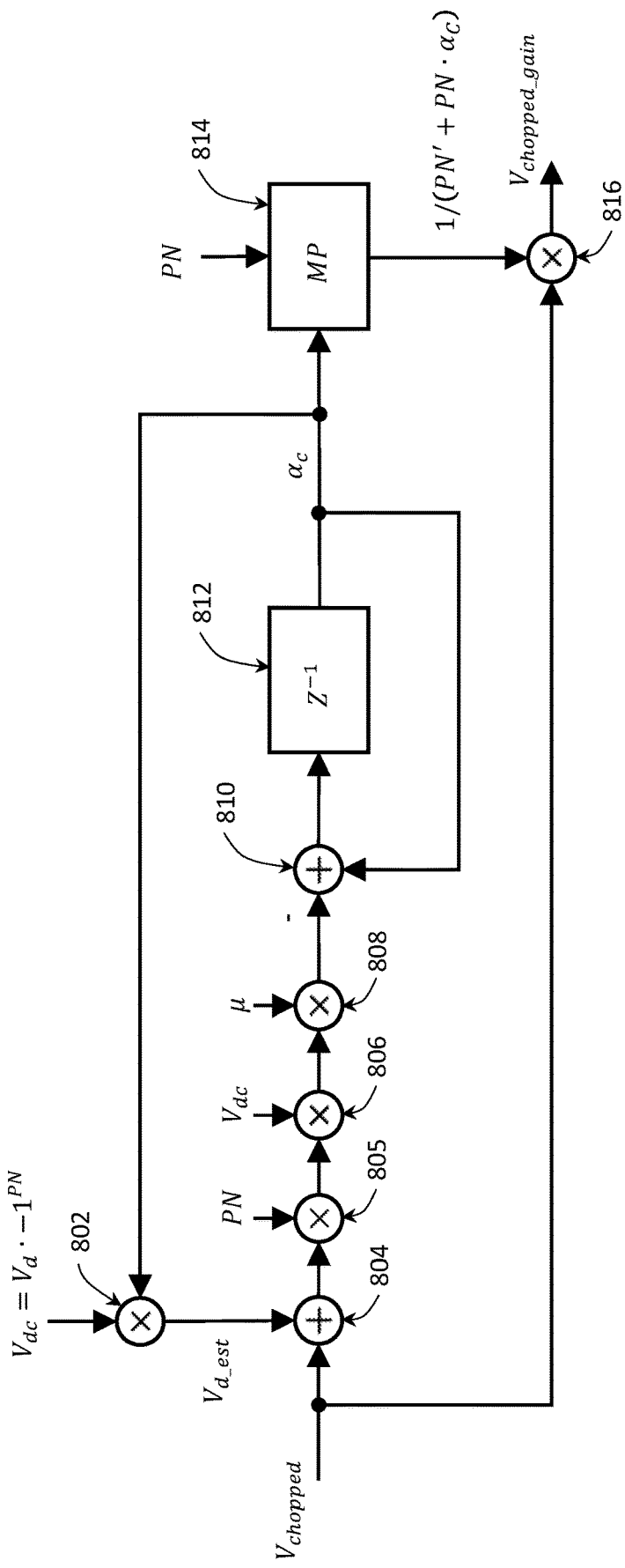
FIG. 7 illustrates another exemplary scheme for removing the gain error, according to some embodiments of the disclosure.

FIG. 7 illustrates yet another exemplary scheme for removing the gain error, corresponding to the LMS equation (13), according to some embodiments of the disclosure. In an alternative fashion, based on equation (13), the gain error caused by the chopping process can be removed by gain cancellation circuitry operating on the chopped signal $V_{chopped}$. Multiplier 802 performs $\alpha_c[n] \cdot V_{dc}[n]$ (shown as dither estimate $V_{d\_est}$ in FIG. 7) by multiplying $V_{dc}[n]$ and $\alpha_c[n]$. Summation node 704 performs $(V_{chopped}[n] + \alpha_c[n] \cdot V_{dc}[n])$ by adding $V_{chopped}[n]$ and $\alpha_c[n] \cdot V_{dc}[n]$. Multiplier 805 performs $PN[n] \cdot (V_{chopped}[n] + \alpha_c[n] \cdot V_{dc}[n])$ by multiplying PN[n] and $(V_{chopped}[n] + \alpha_c[n] \cdot V_{dc}[n])$. Multiplier 805 performs binning by making the error term zero when PN=0. Multiplier 806 performs correlation, i.e., $V_{dc}[n] \cdot PN[n] \cdot (V_{chopped}[n] + \alpha_c[n] \cdot V_{dc}[n])$, by multiplying $V_{dc}[n]$ and $PN[n] \cdot (V_{chopped}[n] + \alpha_c[n] \cdot V_{dc}[n])$ Multiplier 808 performs $\mu \cdot V_{dc}[n] \cdot PN[n] \cdot (V_{chopped}[n] + \alpha_c[n] \cdot V_{dc}[n])$ by multiplying convergence coefficient $\mu$ and $V_{dc}[n] \cdot PN[n] \cdot (V_{chopped}[n] + \alpha_c[n] \cdot V_{dc}[n])$. Summation node 810 performs $\alpha_c[n] - \mu \cdot V_{dc}[n] \cdot PN[n] \cdot (V_{chopped}[n] + \alpha_c[n] \cdot V_{dc}[n])$ by adding $-\mu \cdot V_{dc}[n] \cdot PN[n] \cdot (V_{chopped}[n] + \alpha_c[n] \cdot V_{dc}[n])$ and $\alpha_c[n]$. The final result $\alpha_c[n]$ is delayed by delay block 812 to form an updated correction term $\alpha_c[n+1]$.

LMS equation (13) is performed before unchopping, and the converged value for correction term $\alpha_c$ is used for correcting the output. Specifically, the correction term $\alpha_c$ can be used to reduce the gain error. The correction equations applying the correction term corresponding to LMS equation (13) can be as follows:

$$V_{chopped\_gain} = V_{chopped}[n] \left( \frac{1}{PN'[n] + PN[n] \cdot \alpha_c} \right) \quad (14)$$

Other correction equations can be used, and may depend on how the correction term is defined.

Referring back to FIG. 7, block 814 and multiplier 816 obtain the chopped signal with the gain error removed $V_{chopped\_gain}[n]$. Block 814 takes PN[n] and converged/converging value of correction term $\alpha_c$ as inputs and calculates multiplicative factor $$\frac{1}{PN'[n] + PN[n] \cdot \alpha_c}.$$

Finally, multiplier 816 multiplies $V_{chopped}[n]$ and multiplicative factor $$\frac{1}{PN'[n] + PN[n] \cdot \alpha_c}$$

to obtain me gain error corrected chopped signal $V_{chopped\_gain}[n]$. The multiplicative factor used in obtaining $V_{chopped}[n]$, i.e., $$\frac{1}{PN'[n] + PN[n] \cdot \alpha_c},$$

accounts for the gain error. The gain cancellation circuitry seen in FIG. 8 can correct for gain error in the chopping process. Note that when PN=0 (PN'=1), block 814 computes $$\frac{1}{1 + 0 \cdot \alpha_c} = 1$$

as the multiplicative factor, and when PN=1 (PN'=0), block 814 computes $$\frac{1}{0 + 1 \cdot \alpha_c} = \frac{1}{\alpha_c}$$

as the multiplicative factor. In this particular example, correction term $\alpha_c$ is representing the inverse of the gain (with error). A subsequent process, e.g., a further multiplier for multiplying the gain error corrected chopped signal $V_{chopped\_gain}[n]$ by $-1^{PN}$, can be implemented to perform unchopping.

The implementation in FIG. 7 can be used for computing a gain correction term for a chopping state where PN[n]=1. Only data associated with PN[n]=1 is used for updating the correction term. In other words, when PN[n]=0, the LMS equation does not update the correction term.

It is possible to expand equation (13) to determine chopping state dependent correction terms (one for each chopping state, and not assume that a gain for one chopping state is unity or equals to 1) as follows:

$$\alpha_{c1}[n+1] = \alpha_{c1}[n] - \mu \cdot V_{dc}[n] \cdot PN[n] \cdot (V_{chopped}[n] + \alpha_{c1}[n] \cdot V_{dc}[n]) \quad (13i)$$

$$\alpha_{c2}[n+1] = \alpha_{c2}[n] - \mu \cdot V_{dc}[n] \cdot PN'[n] \cdot (V_{chopped}[n] - \alpha_{c2}[n] \cdot V_{dc}[n]) \quad (13ii)$$

The use of PN[n] and PN'[n] in the respective equations (13i) and (13ii) enables binning so that the LMS equation (13i) for $\alpha_{c1}$ is only updating when PN[n]=1, and the LMS equation (13ii) for $\alpha_{c2}$ is only updating when PN'[n]=1. Accordingly, $\alpha_{c1}$ is the gain correction term for the chopping state when PN=1, PN'=0, and $\alpha_{c2}$ is the gain correction term for the chopping state when PN'=1, PN=0. Other formulations to extract chopping state dependent gain error are envisioned by the disclosure, where PN[n] is used for binning data to update $\alpha_{c1}$ and PN'[n] is used for binning data to update $\alpha_{c2}$. In some cases, equation (13ii) can be defined as follows: $\alpha_{c2}[n+1]=\alpha_{c2}[n]-\mu \cdot V_{dc}[n] \cdot PN'[n] \cdot (V_{chopped}[n]+\alpha_{c2}[n] \cdot V_{dc}[n])$.

Figure 8:
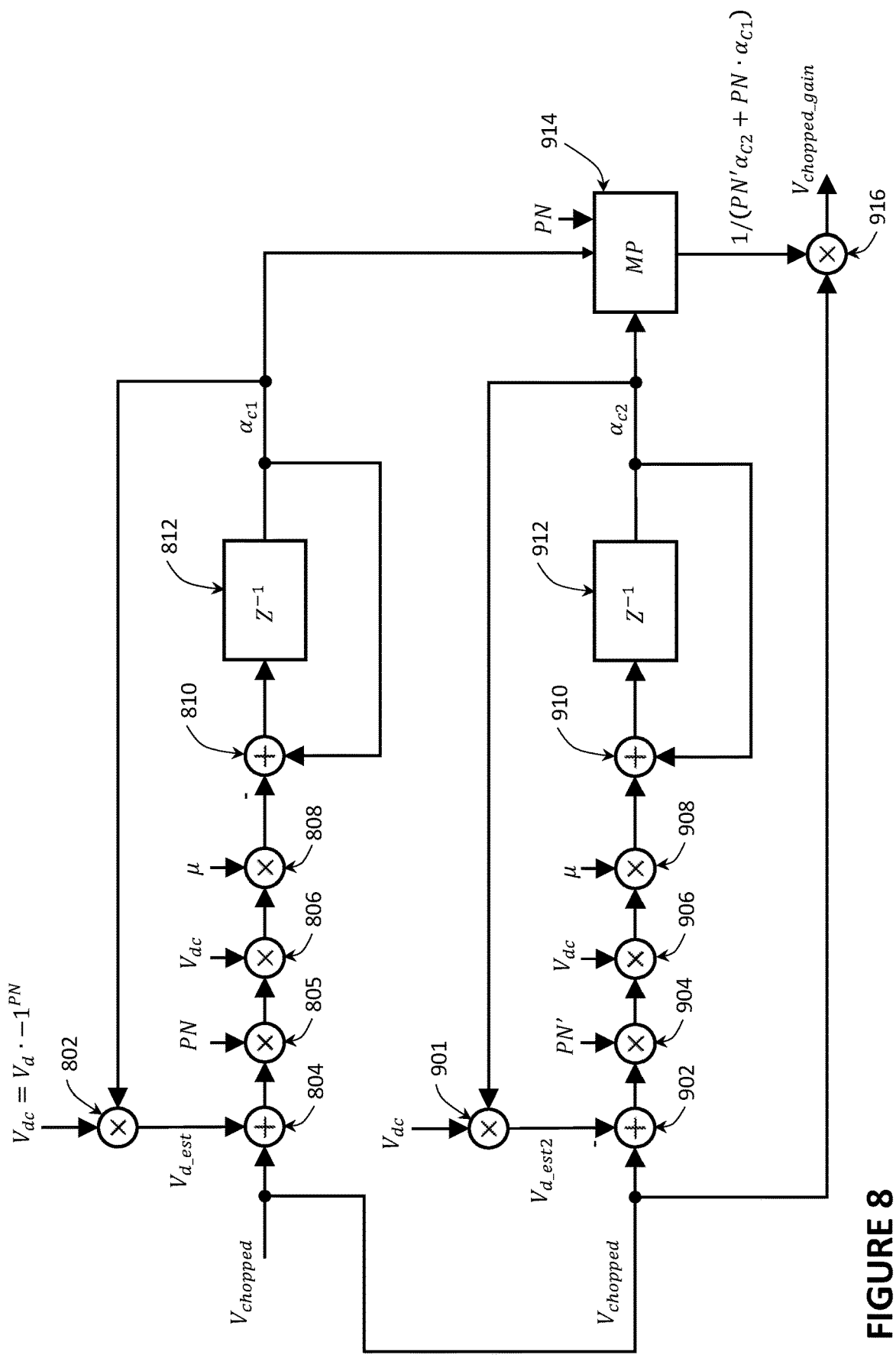
FIG. 8 illustrates yet another exemplary scheme for removing the gain error, according to some embodiments of the disclosure.

FIG. 8 illustrates yet another exemplary scheme for removing the gain error, corresponding to the LMS equation (13i) and equation (13ii), according to some embodiments of the disclosure. In the example shown, a processing path similar to what is shown in FIG. 7 is included to implement LMS equation (13i) to estimate and update a gain error (correction term) for the first state, i.e., $\alpha_{c1}$, and an added processing path is included to implement LMS equation (13ii) to estimate and update a gain error (correction term) for the second state, i.e., $\alpha_{c2}$. The added processing path implementing LMS equation (13ii) can be similar to what was described in relation to FIG. 7 for implementing LMS equation (13i), with some exceptions. The rest of the operations are similar. Multiplier 901 performs $\alpha_{c2}[n] \cdot V_{dc}[n]$ (shown as dither estimate $V_{d\_est2}$ in FIG. 8) by multiplying $V_{dc}[n]$ and $\alpha_{c2}[n]$. Different from what was shown in FIG. 7, summation node 902 performs $(V_{chopped}[n]-\alpha_{c2}[n] \cdot V_{dc}[n])$ by subtracting $V_{chopped}[n]$ by $\alpha_{c2}[n] \cdot V_{dc}[n]$. Multiplier 904 performs $PN'[n] \cdot (V_{chopped}[n]-\alpha_{c2}[n] \cdot V_{dc}[n])$ by multiplying $PN'[n]$ and $(V_{chopped}[n]-\alpha_{c2}[n] \cdot V_{dc}[n])$. Multiplier 906 performs correlation, i.e., $V_{dc}[n] \cdot PN'[n] \cdot (V_{chopped}[n]-\alpha_{c2}[n] \cdot V_{dc}[n])$ by multiplying $V_{dc}[n]$ and $PN'[n] \cdot (V_{chopped}[n]-\alpha_{c2}[n] \cdot V_{dc}[n])$. Multiplier 908 performs $\mu \cdot V_{dc}[n] \cdot PN'[n] \cdot (V_{chopped}[n]-\alpha_{c2}[n] \cdot V_{dc}[n])$ by multiplying convergence coefficient $\mu$ and $V_{dc}[n] \cdot PN'[n] \cdot (V_{chopped}[n]-a_{c2}[n] \cdot V_{dc}[n])$. Summation node 910 performs $\alpha_{c2}[n]+\mu \cdot V_{dc}[n] \cdot PN'[n] \cdot (V_{chopped}[n]-\alpha_{c2}[n] \cdot V_{dc}[n])$ by adding $\mu \cdot V_{dc}[n] \cdot PN'[n] \cdot (V_{chopped}[n]-\alpha_{c2}[n] \cdot V_{dc}[n])$ and $\alpha_{c2}[n]$. The final result $\alpha_{c2}[n]$ is delayed by delay block 912 to form an updated correction term $\alpha_{c2}[n+1]$.

LMS equations (13i) and (13ii) are performed before unchopping, and the converged values for correction terms $\alpha_{c1}$ and $\alpha_{c2}$ are used for correcting the output. Specifically, the correction terms $\alpha_{c1}$ and $\alpha_{c2}$ can be used to reduce the gain error. The correction equation can be represented by the following:

$$V_{chopped\_gain}[n] = V_{chopped}[n]\left(\frac{1}{PN'[n] \cdot \alpha_{c2} + PN[n] \cdot \alpha_{c1}}\right) \quad (16)$$

which can be approximated as:

$$V_{chopped\_gain}[n] \sim V_{chopped}[n](1-PN[n] \cdot (1-\alpha_{c1})-PN'[n] \cdot (1-\alpha_{c2})) \quad (17)$$

Block 914 can take PN[n] and converged values of correction terms $\alpha_{c1}$ and $\alpha_{c2}$ as inputs and calculates multiplicative factors $$\left(\frac{1}{PN'[n] \cdot \alpha_{c2} + PN[n] \cdot \alpha_{c1}}\right)$$

or $(1-PN[n] \cdot (1-\alpha_{c1})-PN'[n] \cdot (1-\alpha_{c2}))$. Finally, multiplier 916 multiplies $V_{chopped}[n]$ and the appropriate calculated multiplicative factors from block 914 to obtain the gain error corrected chopped signal $V_{chopped\_gain}[n]$. Note that when PN=0, block 914 computes $$\left(\frac{1}{1 \cdot \alpha_{C2} + 0 \cdot \alpha_{C1}}\right) = \frac{1}{\alpha_{C2}}$$

as the multiplicative factor, and when PN=1, block 914 computes $$\left(\frac{1}{0 \cdot \alpha_{C2} + 0 \cdot \alpha_{C1}}\right) = \frac{1}{\alpha_{C2}}$$

as the multiplicative factor. In this particular example, correction terms $\alpha_{c1}$ and $\alpha_{c2}$ are representing the inverse of the gains (with error) corresponding to different chopping states. A subsequent process, e.g., a further multiplier for multiplying the gain error corrected chopped signal $V_{chopped\_gain}[n]$ by $-1^{PN}$, can be implemented to perform unchopping.

Using this correction in equation (17) (and other equations such as equation (14), and equation (16)) to obtain the gain error corrected chopped signal $V_{chopped\_gain}[n]$, the unchopping function performed by equation (12) can be reduced to:

$$V_{unchopped}[n]=-1^{PN[n]} \cdot V_{chopped\_gain}[n] \quad (18)$$

Removing the Additive Dither After Gain Error Correction and Unchopping

Once gain error corrected unchopped signal, i.e., $V_{unchopped}[n]$ from equation 18 or equation 12, is obtained, the additive dither can be removed based on an overall gain correction term. To determine the overall gain estimate (overall gain correction term) $G_e[n]$, the following LMS equation can be used:

$$G_e[n+1]=G_e[n]+\mu \cdot V_d[n] \cdot (V_{unchopped}[n]-G_e[n] \cdot V_d[n]) \quad (19)$$

Figure 9:
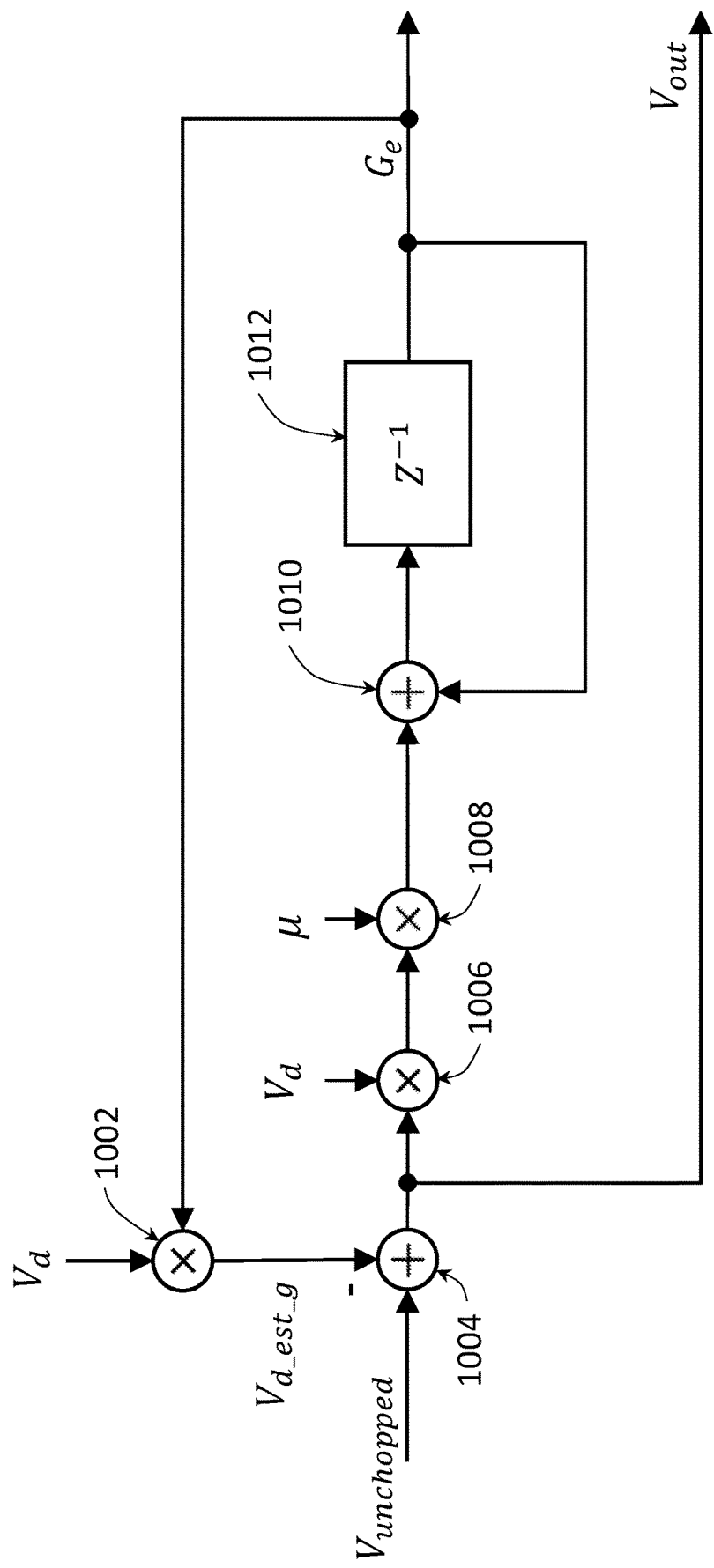
FIG. 9 illustrates an exemplary scheme for removing the additive dither after the errors from chopping are corrected and the signal is unchopped, according to some embodiments of the disclosure.

FIG. 9 illustrates an exemplary scheme for removing the additive dither after the errors from chopping are corrected and the signal is unchopped, according to some embodiments of the disclosure. Operations of equation (19) are performed on $V_{unchopped}$, by the dither removal circuitry seen in FIG. 9. The final output, with the additive dither removed, is given by:

$$V_{out}=V_{unchopped}[n]-G_e[n] \cdot V_d[n] \quad (20)$$

Multiplier 1002 performs $G_e[n] \cdot V_d[n]$ by multiplying $V_d[n]$ and $G_e[n]$. $G_e[n] \cdot V_d[n]$, which forms a dither estimate based on the dither and the overall gain estimate, is shown as $V_{d\_est\_g}$ in FIG. 10. Summation node 1004 performs $(V_{unchopped}[n]-G_e[n] \cdot V_d[n])$ by subtracting $V_{unchopped}[n]$ by $G_e[n] \cdot V_d[n]$. Multiplier 1006 perform correlation, i.e., $V_d[n] \cdot (V_{unchopped}[n]-G_e[n] \cdot V_d[n])$, by multiplying $V_d[n]$ and $(V_{unchopped}[n]-G_e[n] \cdot V_d[n])$. $V_d[n] \cdot (V_{unchopped}[n]-G_e[n] \cdot V_d[n])$ can be considered the error term. When the overall gain estimate $G_e[n]$ converges to a right value, pre-chopping dither $V_d[n]$ is expected to be uncorrelated with the unchopped signal with the dither estimate removed $(V_{unchopped}[n]-G_e[n] \cdot V_d[n])$. Multiplier 1008 performs $\mu \cdot V_d[n] \cdot (V_{unchopped}[n]-G_e[n] \cdot V_d[n])$ by multiplying $\mu$ and $(V_{unchopped}[n]-G_e[n] \cdot V_d[n])$. Summation node 1010 performs $G_e[n]+\mu \cdot V_d[n] \cdot (V_{unchopped}[n]-G_e[n] \cdot V_d[n])$ by adding $G_e[n]$ and $\mu \cdot V_d[n] \cdot (V_{unchopped}[n]-G_e[n] \cdot V_d[n])$. Delay block 1012 delays the result to form the updated overall gain estimate (correction term) $G_e[n+1]$. In some cases, the post-chopping dither $V_{dc}$ is used in place of the pre-chopping dither $V_d$.

When gain error extraction and correction do not assume that the gain of one chopping state is 1 and the gain error for each state of the chopper are separately accounted for and removed, and there is no need to apply equations (19) and (20) any longer to account for the overall gain. However, if one chopping state is assumed to have a gain of 1, equation (19) may be used to extract and remove the overall gain error.

Chopping Non-Linear Error

Techniques for correcting offset and gain errors of a random chopper can be extended to accommodate other kinds of errors (such as non-linear errors) if needed. In general, non-linear errors tend to be much smaller in magnitude than offset and gain errors. The effect of non-linear error on the signal can be characterized as follows:

$$f_c(V_{in}) = -1^{PN} \cdot V_{in} + PN \cdot \alpha_{NL} V_{in}^3 \quad (21)$$

where $\alpha_{NL}$ represents a third order distortion mismatch between the chopping states. The error term can be obtained using the correlation or a histogram method while being modulated by the chopping function (shown as PN, or the states of the random chopper) as follows:

$$\varepsilon_{HD3\_1}(V_{insp}) = PN \cdot [Cumsum_{V_{insp}}(V_{chopped\_NL} - V_d)|_{Dither=V_d} \quad (22)$$
$$- Cumsum_{V_{insp}}(V_{chopped\_NL} + V_d)|_{Dither=-V_d}]$$

and $$\varepsilon_{HD3\_1}(-V_{insp}) = PN \cdot [Cumsum_{-V_{insp}}(V_{chopped\_NL} + V_d)|_{Dither=-V_d} \quad (23)$$
$$- Cumsum_{-V_{insp}}(V_{chopped\_NL} - V_d)|_{Dither=V_d}]$$

and $$\varepsilon_{HD3\_1} = \varepsilon_{HD3\_1}(V_{insp}) - \varepsilon_{HD3\_1}(-V_{insp}) \quad (24)$$

where $Cumsum_x(y)$ is the cumulative histogram (i.e., count) of digital codes of digital signal y less than or equal to x. $\varepsilon_{HD3\_1}(V_{insp})$ is a partial error at a positive inspection point $V_{insp}$ and $\varepsilon_{HD3\_1}(V_{insp})$ is a partial error at a negative inspection point $V_{insp}$. $\varepsilon_{HD3\_1}$ is a combination of the partial error at the positive inspection point and the partial error at the negative inspection point, which can expose the third order distortion. The notation $PN \cdot [\cdots]$ denotes that only data associated with PN=1 is used in computing the partial error, and that the partial error is computed for the state where PN=1. Accordingly, modulating by the chopping function means that PN is used for binning/gating the data to allow for partial errors to be computed for the chopping state where PN=1. In some cases, the post-chopping dither $V_{dc}$ is used in place of the pre-chopping dither $V_d$.

In this example, inspection points $V_{insp}$ and $-V_{insp}$ are chosen to expose the shape of the non-linear error of interest. For extracting a third order distortion, the inspection points are chosen to expose the odd symmetry associated with a third order distortion, and the inspection points define ranges or open intervals for the counts (cumulative histograms). Inspection points can be at the dither amplitude $+/-V_d$, for instance. The counts for when the dither is positive are compared with the counts for when the dither is negative.

The above formulation in equation (22) finds a count for the chopped signal $V_{chopped\_NL}$ with the dither $V_d$ removed being less than or equal to the positive inspection point $V_{insp}$ when the dither is positive and a count for the chopped signal $V_{chopped\_NL}$ with the dither $V_d$ removed being less than or equal to the positive inspection point $V_{insp}$ when the dither is negative. The above formulation in equation (23) finds a count for the chopped signal $V_{chopped\_NL}$ with the dither $V_d$ removed being less than or equal to the negative inspection point $-V_{insp}$ when the dither is negative and a count for the chopped signal $V_{chopped\_NL}$ with the dither $V_d$ removed being less than or equal to the negative inspection point $-V_{insp}$ when the dither is positive. The partial error terms compares the two counts at the given inspection point. The comparison is modulated by the chopping function PN. This means that only data associated with PN=1 is used (and data associated with PN=0 is not used in the calculation). The difference in counts exposes the shape of a third order non-linearity, and equation (24) looks at the difference in the two partial error terms $\varepsilon_{HD3\_1}(V_{insp})$ and $\varepsilon_{HD3\_1}(-V_{insp})$ (i.e., partial error term at the positive inspection point, and partial error term at the negative inspection point).

The error term, e.g., $\varepsilon_{HD3\_1}$, exposes the third order distortion terms for a chopping state where PN=1, and can be used for updating following LMS update equation to obtain an updated correction term for $\alpha_{NL\_1}(n)$ associated with the chopping state where PN=1:

$$\alpha_{NL\_1}(n+1) = \alpha_{NL\_1}(n) + \mu \times \varepsilon_{HD3\_1} \quad (25)$$

where the final error term for third order distortion $\varepsilon_{HD3\_1}$ from equation (24) specific to the chopping state PN=1 and an convergence coefficient $\mu$ to update the correction term $\alpha_{NL\_1}(n)$ associated with the chopping state PN=1 are to be used in the correction. Accordingly, the corrected output $V_{chopped\_NL}[n]$ is given by the following exemplary correction equation:

$$V_{chopped\_NL}[n] = V_{chopped}[n] - PN[n] \cdot \alpha_{NL\_1} \cdot V_{chopped}^3[n] + PN[n] \cdot 3 \cdot \alpha_{NL\_1}^2 \cdot V_{chopped}^5[n] \quad (26)$$

As a closed loop calibration system, the corrected signal $V_{chopped\_NL}[n]$ is used again by equations (22) and (23) to continue to estimate and update the third order error term in equation (24) and update the value for the correction term $\alpha_{NL\_1}(n)$ using equation (25).

In some cases, it can be desirable to fix the non-linear error for the two chopping states in conjunction with the gain error associated with the two chopping states. In other words, it is possible to determine non-linear errors separately for both chopping states and obtain different correction terms for the chopping states. Therefore, the combined correction with different correction terms for the two chopping states can be given by:

$$V_{chopped\_NL\_gain}[n] = \qquad (27)$$
$$V_{chopped}[n](1 - PN[n] \cdot (1 - \alpha_{c1}) - PN'[n] \cdot (1 - \alpha_{c2})) -$$
$$PN[n] \cdot \alpha_{NL\_1} \cdot V^3_{chopped}[n] + PN[n] \cdot 3 \cdot \alpha^2_{NL\_1} \cdot V^5_{chopped}[n] -$$
$$PN'[n] \cdot \alpha_{NL\_2} \cdot V^3_{chopped}[n] + PN'[n] \cdot 3 \cdot \alpha^2_{NL\_2} \cdot V^5_{chopped}[n] \text{ where:}$$

$$\alpha_{NL\_2}(n+1) = \alpha_{NL2}(n) + \mu \times \varepsilon_{HD3\_2} \qquad (28)$$

and $$\varepsilon_{HD3\_2}(V_{insp}) = PN' \cdot \left[ Cumsum_{V_{insp}}(V_{chopped\_NL} - V_d)\big|_{Dither=V_d} \right. \qquad (29)$$
$$\left. - Cumsum_{V_{insp}}(V_{chopped\_NL} + V_d)\big|_{Dither=-V_d} \right]$$

and $$\varepsilon_{HD3\_2}(-V_{insp}) = PN' \cdot \left[ Cumsum_{-V_{insp}}(V_{chopped\_NL} + V_d)\big|_{Dither=-V_d} \right. \qquad (30)$$
$$\left. - Cumsum_{-V_{insp}}(V_{chopped\_NL} - V_d)\big|_{Dither=V_d} \right]$$

$$\text{And } \varepsilon_{HD3\_2} = \varepsilon_{HD3\_2}(V_{insp}) - \varepsilon_{HD3\_2}(-V_{insp}) \qquad (31)$$

In equations (29) and (30), partial error terms are computed at the positive and negative inspection points using data associated with the chopping state where PN'=1. Data associated with the chopping state PN'=0 is not used in the calculation. The notation PN'·[···] denotes that only data associated with PN'=1 is used in computing the partial error, and that the partial error is computed for the state where PN=1. Accordingly, PN' is used for binning the data to allow for partial errors to be computed for a chopping state where PN'=1. The partial errors can be combined according to equation 31. $\varepsilon_{HD3\_2}$ is a combination of the partial error at the positive inspection point and the partial error at the negative inspection point, which can expose the third order distortion. The error term, e.g., $\varepsilon_{HD3\_2}$, exposes the third order distortion terms for a chopping state where PN'=1, and can be used for updating LMS update equation according to equation (28) to obtain an updated correction term for $\alpha_{NL\_2}(n)$ associated with the chopping state where PN'=1.

Therefore, the non-linear chopping error can be corrected together with the gain and offset errors. Once corrected, the unchopping can be performed as before:

$$V_{unchopped}[n] = -1^{PN[n]} \cdot V_{chopped\_NL\_gain}[n] \qquad (32)$$

Then, the additive dither subtraction can be performed as shown in equations (19) and (20).

Variations to the Partial Error Calculations, Error Formulations, and LMS Equation Formulations in the Non-Linear Error Correction Schemes The examples herein merely illustrate exemplary implementations for carrying out the counting or histogram-based approach. Other solutions are envisioned by the disclosure.

Partial error equations can differ from one implementation to another. Primarily, the partial error equations compare counts/histograms between different values of the dither. However, the values of the dither chosen for the comparison can depend on the implementation. For instance, in various partial error equations, certain values of the dither can be chosen for the comparison (not only +Vd and −Vd). The choice of the values of the dither can vary from one implementation to another. Also, the choice of the values of the dither can depend on the type of non-ideality to be extracted and how the error equations are formulated to extract the non-ideality. Preferably, the values of the dither used in the comparison are chosen to expose or accentuate the shape or pattern associated with the non-ideality. Certain values of the dither signal can result in greater amount of distortion in the output. Choosing those values of the dither signal for the comparison that can cause the greater amount of distortion can make extracting the shape or pattern associated with the non-ideality easier and more effective.

Likewise, the definitions of the partial error equations or parameters can vary from one implementation to another. Primarily, partial error equations define ranges based on inspection points, and compare counts/histogram-based on the ranges. Also, as illustrated by the examples herein, the definitions of the partial error equations can depend on the type of non-ideality to be extracted. In some cases, various partial error equations or equations defining an error at a given inspection point can use overlapping ranges. The type of ranges used in partial error equations can differ from one implementation to another. Alternatively, non-overlapping ranges can be used. Instances of $Cumsum_{V_{insp}}(.)$ for the positive inspection point $V_{insp}$ can be replaced by $Cumsump_{V_{insp}}$, where $Cumsump_x(y)$ is the cumulative histogram (i.e., count) of digital codes of digital signal y greater than or equal to x. Instances of $Cumsum_{-V_{insp}}(.)$ for the negative inspection point $-V_{insp}$ can be replaced by $Cumsumn_{-V_{insp}}$, where $Cumsumn_x(y)$ is the cumulative histogram (i.e., count) of digital codes of digital signal y less than or equal to x. The parameters enhancing even and odd symmetrical errors can also be varied in the same manner to use non-overlapping ranges.

Depending on the non-linearity, different inspection points can be chosen to expose or accentuate the shape or pattern associated with the non-linearity. For instance, higher order distortions tend to be more present when the magnitude of the signal is larger, and larger magnitude inspection points can be selected for exposing higher order non-linearities.

Similarly, the error formulations based on the partial errors can vary from one implementation to another. Preferably, the error equations are defined in such a way to combine partial errors and to expose or accentuate the shape or pattern associated with the non-ideality. For instance, summing partial errors can exposes or accentuates the even order symmetry associated with second order or fourth order non-linearity. The difference in the errors can expose or accentuate the odd order symmetry associated with third order or fifth order non-linearity. The even and odd order errors can be are defined in opposite manner of each other to expose the difference in even and odd symmetries associated with the even order non-linearity and odd order non-linearity respectively. The opposite equation formulations can also be used in exposing the difference in symmetries for other pairs of error equations and non-linearities. Other error formulations are possible so long as they are defined in such a way to expose or accentuate the different shapes associated with various non-idealities. Many examples herein illustrate the flexibility in the approach.

Implementing Cumulative Histograms Efficiently in Digital Hardware

Many of the equations described herein, such as ones seen with the non-linear error correction, utilize cumulative histograms defined by inspection points, i.e., accumulating/keeping a count of the output falling within a range defined by an inspection point, and the counts or cumulative histograms are computed based on a block of data or many samples. Moreover, the error and/or partial errors are defined by a comparison of counts associated with different values of the dither. In other words, counting and comparing the counts for different dither values (e.g., positive dither and negative dither) helps to extract shape/pattern of a non-linearity or gain error at a given inspection point. Calibrating based on a block of data can be robust (making sure that calibrations do not diverge easily, since the errors are being extracted based on data gathered over a period of time), but it also means that calibration can take more time, and keeping/accumulating counts for many samples can add complexity.

Counting the output with the dither removed falling within a range defined by an inspection point and comparing counts between different values of the dither signal can be implemented in digital hardware efficiently, if counting and comparing counts are done incrementally or sample-by-sample (as opposed to computing a cumulative histogram over a large block of data). Incremental or sample-by-sample counting and updating an LMS equation at each sample can still converge to minimize the error and update the estimate of the component of the circuit within the calibration loop. Defining and implementing the partial errors and errors to count sample-by-sample, while preserving the effect of comparing counts between different dither values, is not trivial. The incremental or sample-by-sample counting and comparisons is a special case or implementation of the histogram technique.

Instead of counting over a large block of data and determining how many samples fall within a range defined by an inspection point, incremental or sample-by-sample counting can determine whether each sample, i.e., the output with the dither removed, is a hit within the range defined by the inspection point. If the sample, i.e., the output with the dither removed, is a hit, then a value can be assigned to count the sample. Moreover, the comparison between counts can be performed incrementally if a value of +1 is assigned to a hit for one dither value, and a value of −1 is assigned to a hit for another dither value. The opposite values, e.g., +1 and −1, can represent an incremental difference/comparison being made between the two dither cases. As each sample is counted and the LMS equation is updated, the calibration loop can converge to a steady state to make sure that the number of hits resulting in a +1 and the number of hits resulting in a −1 are equalized. When the steady state is reached, it is as if the counts between different values of the dither signal are equal, and thus the LMS update equation would stabilize and converge to an appropriate estimate of a component of the circuit. The calculation can be simplified even further if a positive dither and a negative dither is used, since a sign bit of the dither can be used to represent +1 and −1. Accordingly, formulating partial errors and errors and updating an LMS equation using the sign bit of the dither for each hit, can effectively yield the same effect as counting and comparing counts between different dither values.

To implement incremental counting, various error estimate equations, such as equations (22), (23), (29), and (30), each forming a partial errors at a given inspection point, e.g., inspection points $V_{insp}$ and $-V_{insp}$, based on cumulative histograms (i.e., count of values with a range defined by the given inspection point) and a difference between two cumulative histograms, can be defined differently, as follows:

$$\varepsilon_{HD3\_1}(V_{insp}) = \varepsilon_{HD3\_2}(V_{insp}) = \mathrm{sign}(V_d) \cdot \mathrm{hit}_{>insp}(V_{chopped_{NL}} - V_d) \quad (33)$$

and $$\varepsilon_{HD3\_1}(-V_{insp}) = \varepsilon_{HD3\_2}(-V_{insp}) = \mathrm{sign}(V_d) \cdot \mathrm{hit}_{<-V_{insp}}(V_{chopped_{NL}} - V_d) \quad (34)$$

$\mathrm{hit}_{>x}(y)$ returns 1 if y is greater than or equal to x, and returns 0 otherwise. $\mathrm{hit}_{<x}(y)$ returns 1 if y is less than or equal to x, and returns 0 otherwise. $\mathrm{sign}(V_d)$ examines the sign of the pre-chopping dither. Accordingly, $\mathrm{sign}(V_d)$ returns +1 if the pre-chopping dither is a positive dither, and $\mathrm{sign}(V_d)$ returns −1 if the pre-chopping dither is a negative dither. If the output with the dither removed, e.g., $V_{chopped\_NL}-V_d$, is a hit within the range defined by the inspection point (e.g., greater than or equal to the inspection point $V_{insp}$, or less than or equal to the inspection point $-V_{insp}$), then the sign of the pre-chopping dither is the partial error at the inspection point. If the output with the dither removed, e.g., $V_{chopped\_NL}-V_d$, is not a hit within the range defined by the inspection point, then the partial error at the inspection point is zero. The two partial errors computed in equations (33) and (34) can be combined to form the error $\varepsilon_{HD3\_1}$ and the error $\varepsilon_{HD3\_2}$, in the same manner as equation (24) and (31). In some cases, the post-chopping dither $V_{dc}$ is used in place of the pre-chopping dither $V_d$.

The above partial errors computed incrementally or sample-by-sample as illustrated above can be used in the following LMS equation, which is modulated/binned/gated by the chopping state PN or PN':

$$\alpha_{NL\_1}(n+1) = \alpha_{NL\_1}(n) + \mu \times PN \times \varepsilon_{HD3\_1} \quad (35)$$

$$\alpha_{NL\_2}(n+1) = \alpha_{NL\_2}(n) + \mu \times PN' \times \varepsilon_{HD3\_2} \quad (36)$$

The LMS equation (35) updates only when PN=1 and does not update when PN=0. The LMS equation (36) updates only when PN'=1 and does not update when PN'=0. Accordingly, $\alpha_{NL\_1}$ is binned by PN, and is specific to the chopping state where PN=1, and $\alpha_{NL\_2}$ is binned by PN', and is specific to the chopping state where PN'=1.

Other Chopping Errors

The described approaches can be extended to fix other possible kinds of chopping errors. For example, if the chopping is performed in the sampling phase (as opposed to the hold phase as shown in FIGS. 1-3), it may cause timing errors. In this case, the same approaches could be used to detect and correct the chopping-dependent timing errors. An error formulation can be defined to extract the timing error. Binning/gating can be used by applying PN or PN' appropriately to ensure that different timing error correction terms are computed. In other words, only data associated with a first chopping state is used to compute a first timing error associated with the first chopping state, and only data associated with a second chopping state is used to compute a second timing error associated with the second chopping state. Accordingly, two different correction terms can be obtained and applied to the output depending on the chopping state. It is envisioned by the disclosure that the same approaches can be used to detect and correct other types of chopping-dependent errors not mentioned explicitly herein.

Systems and Methods for Calibrating a Random Chopper

Figure 10:
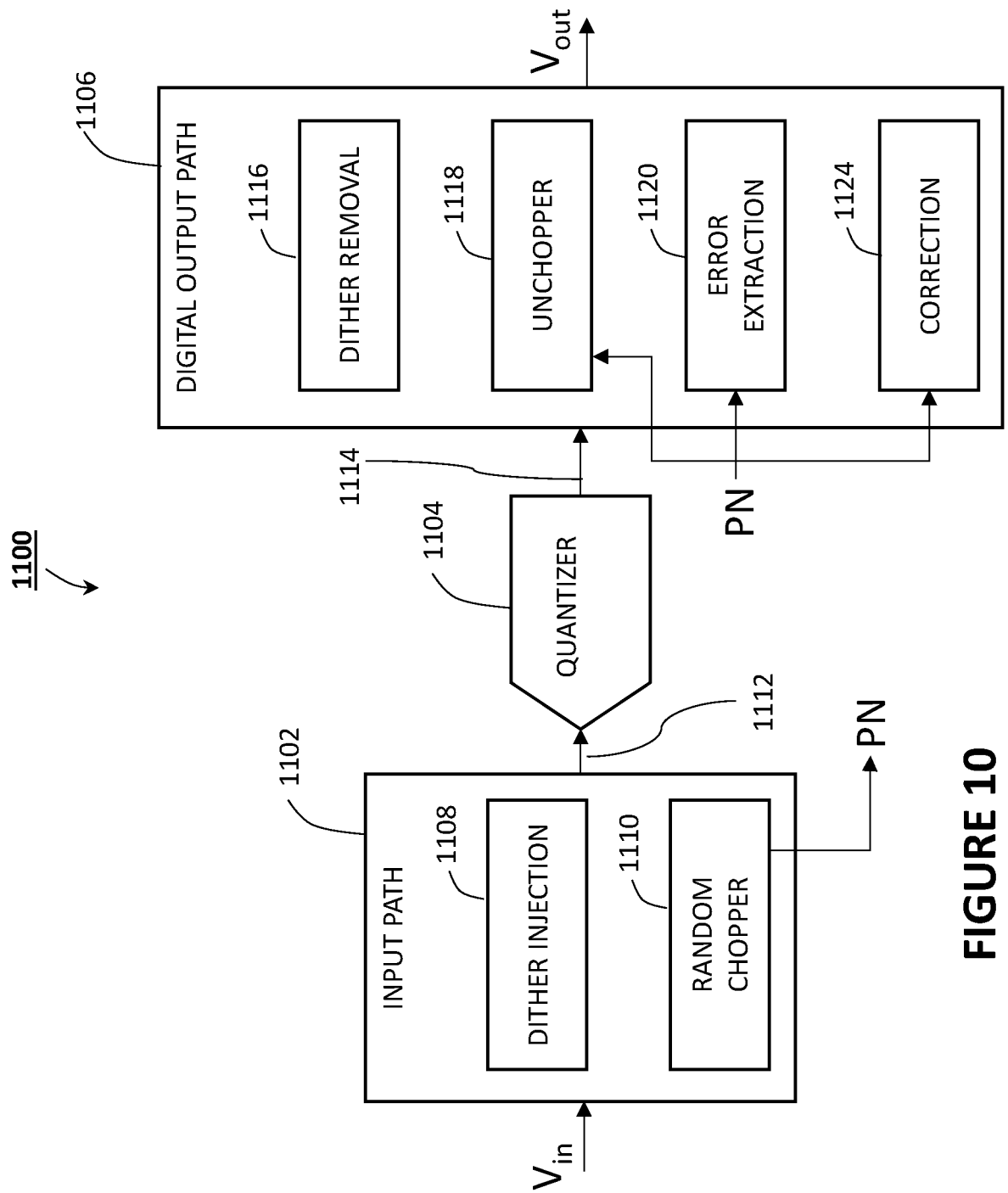
FIG. 10 illustrates a converter system with chopper calibration, according to some embodiments of the disclosure.

FIG. 10 illustrates a converter system 1100 with chopper calibration, according to some embodiments of the disclosure. The converter system 1100 can be a data converter, such as an ADC. The converter system 1100 includes an input path 1102, quantizer 1104, and digital output path 1106. The converter system 1100 receives an analog input signal $V_{in}$ and generates a digital output signal $V_{out}$ representative of the analog input signal $V_{in}$.

The input path 1102 receives the analog input signal and includes dither injection 1108 and random chopper 1110. The input path 1102 can be implemented based on circuitry illustrated by FIGS. 1-3 and variations thereof. The random chopper 1110 can have non-idealities that can affect the performance of the converter system 1100. The dither signal being injected (e.g., added) to the input path 1102 in dither injection 1108 and removed in the digital output path 1106 by dither removal 1116 can be used, in certain cases, to extract the non-idealities of the random chopper 1110. The additive dither used in dither injection 1108 is not to be confused or construed as the same multiplicative dither used in random chopper 1110. Both dithers are pseudo-random signals but are used differently (and serve different purposes) and would not be the same dither signal.

The chopped input signal having the dither signal (1112) is quantized by quantizer 1104 to generate a digital version of the chopped input signal having the dither signal (1114).

The digital output path 1106 receives the digital version of the chopped input signal having the dither signal. The digital output path 1106 performs several functions in the digital domain. The digital output path 1106 has dither removal 1116, which can remove the dither signal injected by dither injection 1108 and has an unchopper 1118 to unchop the signal in the same way it was chopped by the random chopper 1110. Furthermore, the digital output path 1106 has error extraction 1120 to extract the error (e.g., error terms) caused by non-idealities of the random chopper 1110 and correction 1124 to correct the digital output signal by computing one or more correction terms that minimizes the error and generate a final (corrected) $V_{out}$ using the one or more correction terms. Error extraction 1120 and correction 1122 can implement an adaptive scheme based on LMS techniques, and can drive the error smaller and smaller over time. Error(s) are provided as input to the LMS equation, and the result of the LMS equation (updated correction term) would be the correction term that is used to reduce the error over time. The chopper state PN can be used for binning/gating the data to determine error terms which are chopper state dependent. The chopper state PN can be used to ensure that the correction term corresponding to a specific chopper state is appropriately applied to the data. The corrected output is used for further error estimation in this adaptive scheme, in a closed loop.

Depending on the non-ideality to be calibrated out, the schemes for formulating the error of interest and the correction term(s) and equation(s) to be applied can differ between non-idealities. The different schemes for extracting the error and correcting for non-idealities such as offset, gain, non-linearities, etc. are described herein.

In some cases, correction 1124 can be incorporated with one or more of: dither removal 1116 and unchopper 1118. Error extraction 1120 can implement the functionalities for determining error and correction 1124 can determine the correction terms based on the errors. Correction 1124 can then apply the correction terms to the digital signal, in cooperation with dither removal 1116 and unchopper 1118, to generate the final corrected unchopped output with the dither signal removed.

Exemplary implementations for the digital output path 1106 are illustrated by FIGS. 5-9 and the accompanying description. The digital output path 1106 can be implemented with one or more of the following: (dedicated/specialized) digital logic or circuitry and an (on-chip) microprocessor programmable to carry out the digital functionalities herein. Any one or more of block 614 of FIG. 6, block 814 of FIG. 7, and block 914 of FIG. 8 can be implemented on a microprocessor (indicated as "MP" in the FIGURES).

Figure 11:
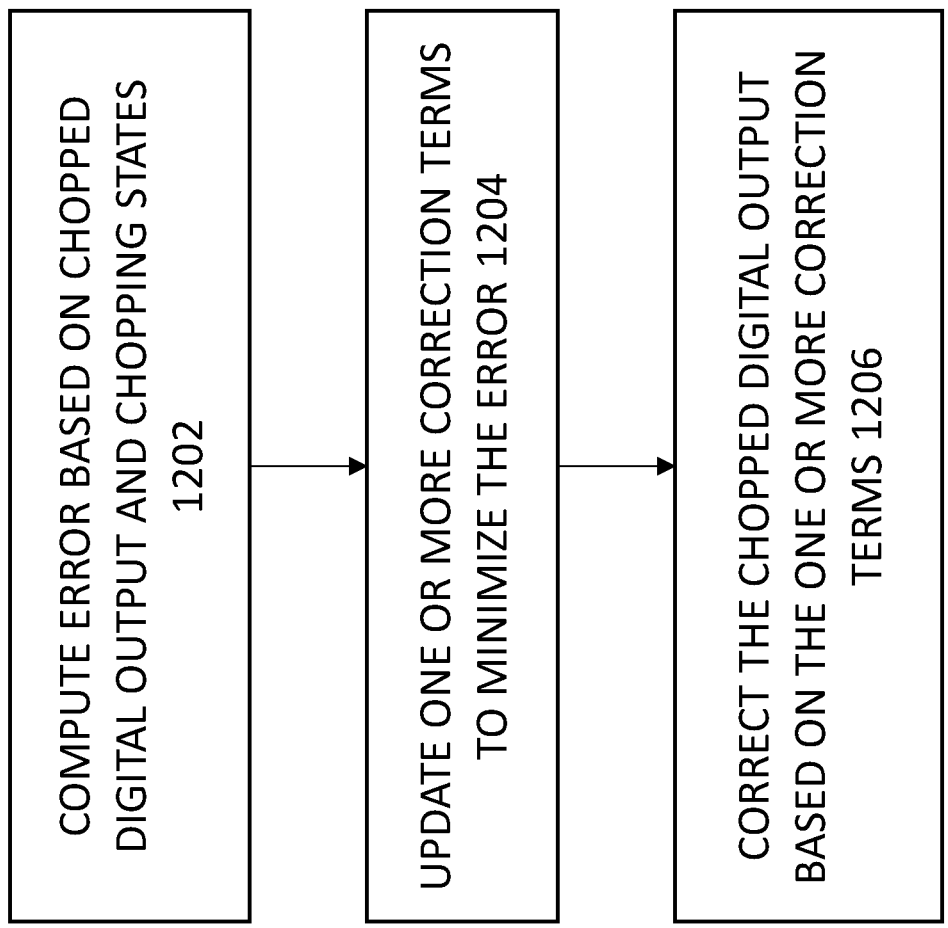
FIG. 11 is a flow diagram illustrating a method for chopper calibration, according to some embodiments of the disclosure.

FIG. 11 is a flow diagram illustrating a method for chopper calibration, according to some embodiments of the disclosure. In 1202, an error of interest is computed based on the chopped digital output and chopping states. In 1204, one or more correction terms are updated to minimize the error. In 1206, the chopped digital output is corrected based on the one or more correction terms.

Technical Advantages and Examples

The LMS update equations included herein are merely illustrative. The implementation of the LMS algorithm can vary from one implementation to another as long as the error terms are setup appropriately to expose the error caused by the non-ideality of interest and as negative feedback as the LMS loop converges.

In this disclosure, techniques are proposed to correct for the non-idealities of the random chopping process. The techniques eliminate the non-ideal effects in the chopping process, and hence enable the full utilization of its benefits. These techniques require very little overhead in terms of power and complexity.

Example 101 is a converter system having chopper calibration, comprising: a random chopper to randomly chop an analog signal; a quantizer for converting the chopped analog signal into a chopped digital signal; an error extraction part to extract one or more errors caused by one or more non-idealities of a random chopper based on a chopped digital signal and states of the random chopper; a correction part to update the one or more correction terms to minimize the one or more errors and apply the one or more correction terms to the chopped digital signal.

In Example 102, the converter system of Example 101, can optionally include the error extraction part extracting an offset error caused by the random chopper by subtracting the chopped digital signal by an offset correction term updated by the correction part.

In Example 103, the converter system of Example 101 or 102 can optionally include: a dither injection part to inject an additive dither to the analog signal.

In Example 104, the converter system of Example 103 can optionally include the error extraction part extracting one or more errors caused by one or more non-idealities of a random chopper based on the chopped digital signal, the states of the random chopper, and the additive dither.

In Example 105, the converter system of Examples 103 or 104 can optionally the error extraction part being configured to perform correlations between the additive dither and the chopped digital signal with the additive dither removed.

In Example 106, the converter system of any one of Examples 103-105 can optionally the error extraction part being configured to perform correlations between the additive dither and the chopped digital signal with the additive dither removed separately for the states of the random chopper.

In Example 107, the converter system of any one of Examples 103-106 can optionally include the correction part being configured to determine one or more multiplicative factors based on the one or more correction terms and applying the multiplicative factors to unchop the chopped signal and reduce the one or more errors.

In Example 108, the converter system of any one of Examples 101-107 can optionally the error extraction part being configured to determine counts of the chopped digital signal with the additive dither removed within open intervals defined by inspection points and comparing the counts associated with polarities of the additive dither.

In Example 109, the converter system of Example 108, the error extraction part being further configured to modulate the comparing of counts by the states of the random chopper.

In Example 110, the converter system of any one of Examples 101-109 can optionally include the correction part being configured to update the one or more correction terms based on one or more least means squared update equations.

Example 201 is a method for (background) calibration of an analog circuit having a random chopper, comprising: computing one or more error terms based on a chopped digital output and states of the random chopper; updating one or more correction terms to minimize one or more error terms; and correcting and unchopping the chopped digital signal based on the one or more correction terms.

In Example 202, the method of Example 201 can optionally include: computing the one or more error terms further based on an additive dither injected in the analog circuit.

In Example 203, the method of Example 201 or 202 can optionally include: computing the one or more error terms comprising estimating the one or more error terms caused by one or more non-idealities of a random chopper based the chopped digital signal and one or more of the following: the states of the random chopper, and the additive dither.

In Example 204, the method of Example 202 or 203 can optionally include: computing the one or more error terms comprising counting the chopped digital signal with the additive dither removed within open intervals set by inspection points and comparing the counts based on polarities of the additive dither.

In Example 205, the method of any one of Examples 201-204 can optionally include updating the one or more correction terms comprising driving the one or more error terms to zero based on one or more least means squared update equations.

Example A is an apparatus comprising means for implementing/carrying out any one of the methods described herein.

Example 1001 is a data converter system having chopper calibration, comprising: a chopper to change polarity of a differential analog signal and output a chopped differential analog signal; a quantizer to convert the chopped differential analog signal into a chopped digital signal; an error extraction part to extract one or more errors caused by one or more non-idealities of the chopper based on the chopped digital signal and states of the chopper; and a correction part to update one or more correction terms to reduce the one or more errors and apply the one or more correction terms to the chopped digital signal.

In Example 1002, the data converter system of Example 1001 can optionally include the error extraction part extracting and correcting an offset error caused by the chopper by subtracting the chopped digital signal by an offset correction term updated by the correction part.

In Example 1003, the data converter system of Example 1001 or 1002 can optionally include a dither injection part to inject an additive dither to the differential analog signal at a circuit node upstream from the chopper.

In Example 1004, the data converter system of Example 1003 can optionally include the error extraction part extracting the one or more errors based on the chopped digital signal, the states of the chopper, and the additive dither.

In Example 1005, the data converter system of Example 1003 or 1004 can optionally include the error extraction part being to correlate between the additive dither and the chopped digital signal with the additive dither removed.

In Example 1006, the data converter system of any one or more Examples 1003-1005 can optionally include the error extraction part being to, separately for each state of the chopper, correlate the additive dither and the chopped digital signal with the additive dither removed.

In Example 1007, the data converter system of any one or more Examples 1001-1006 can optionally include the correction part being to determine one or more multiplicative factors based on the one or more correction terms and applying the multiplicative factors to the chopped digital signal to reduce the one or more errors.

In Example 1008, the data converter system of any one or more Examples 1001-1007 can optionally include the correction part being to determine one or more multiplicative factors based on the one or more correction terms and applying the multiplicative factors to the chopped digital signal to unchop the chopped digital signal and reduce the one or more errors.

In Example 1009, the data converter system of any one or more Examples 1001-1008 can optionally include the error extraction part being to: determine counts of the chopped digital signal with the additive dither removed within open intervals defined by an inspection point separately for different polarities of the additive dither; and compare the counts associated with the different polarities of the additive dither.

In Example 1010, the data converter system of Example 1009 can optionally include the error extraction part being further to modulate the comparing of the counts by the states of the chopper.

In Example 1011, the data converter system of any one or more Examples 1001-1010 can optionally include the correction part being to update the one or more correction terms based on an error term defined by the chopped digital signal, a convergence coefficient, and a correction term.

Example 1012 is a method for digitally correcting an analog circuit having a chopper, comprising: determining one or more error terms based on a chopped digital output and states of the chopper; updating one or more correction terms to reduce the one or more error terms; and correcting and unchopping the chopped digital output based on the one or more correction terms.

In Example 1013, the method of Example 1012 can optionally include injecting an additive dither in the analog circuit in a circuit node upstream from the chopper.

In Example 1014, the method of Example 1012 or 1013 can optionally include determining the one or more error terms comprising: determining the one or more error terms based on an additive dither injected in the analog circuit.

In Example 1015, the method of any one or more Examples 1012-1014 can optionally include determining the one or more error terms comprising: correlating an additive dither injected in the analog circuit against the chopped digital output with an estimate of a chopped additive dither removed.

In Example 1016, the method of Example 1015 can optionally include determining the one or more error terms further comprising: determining the estimate of the chopped additive dither based on the additive dither, a correction term, and the states of the chopper.

In Example 1017, the method of any one or more Examples 1012-1016 can optionally include correcting and unchopping the chopped digital output based on the one or more correction terms comprising: determining a first multiplicative factor based on a first correction term corresponding to a first of the states of the chopper; and multiplying the chopped digital output by the first multiplicative factor in response to the chopper being in the first of the states of the chopper.

In Example 1018, the method of any one or more Examples 1013-1017 can optionally include removing the additive dither by subtracting the additive dither multiplied by a gain correction term from an unchopped digital signal.

In Example 1019, the method of any one or more Examples 1013-1018 can optionally include determining the one or more error terms comprising: separately for each polarity of the additive dither, counting the chopped digital output with the additive dither removed within open intervals set by a first inspection point; and comparing the counts associated with different polarities of the additive dither.

Example 1020 is an apparatus for digitally assisting an analog circuit, comprising: means for changing polarity of a differential analog signal to generate a chopped analog signal; means for converting the chopped analog signal into a chopped digital signal; means for observing the chopped digital signal to extract one or more errors of the means for changing the polarity of the differential analog signal and determining one or more correction terms to reduce the one or more errors; means for applying the one or more correction terms to the chopped digital signal.

Variations and Implementations

Note that the activities discussed above with reference to the FIGURES are applicable to any integrated circuits that involve processing analog signals and converting the analog signals into digital data using one or more ADCs. The features can be particularly beneficial to high speed ADCs, where input frequencies are relatively high in the giga-Hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beamforming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A data converter system having chopper calibration, comprising:
   a chopper to change polarity of a differential analog signal and output a chopped differential analog signal;
   a quantizer to convert the chopped differential analog signal into a chopped digital signal;
   an error extraction part to update an estimated offset correction term based on the chopped digital signal and an error term; and
   a correction part to apply the estimated offset correction term to the chopped digital signal.

2. The data converter system of claim 1, wherein the error term comprises a difference between the chopped digital signal and a value of the estimated offset correction term.

3. The data converter system of claim 1, wherein the error extraction part is to update the estimated offset correction term further based on a convergence coefficient.

4. The data converter system of claim 1, wherein the error extraction part comprises:
   a first node to subtract the chopped digital signal by a value of the estimated offset correction term to generate the error term; and
   a multiplier to multiply the error term by a convergence coefficient.

5. The data converter system of claim 4, wherein the error extraction part further comprises:
   a second node to add a result of the multiplier to the value of estimated offset correction term to update the estimated offset correction term.

6. The data converter system of claim 1, wherein the correction part comprises:
   a node to subtract the chopped digital signal by a value of the estimated offset correction term.

7. A method for digitally removing offset error caused by chopping, comprising:
   chopping a differential analog signal to generate a chopped differential analog signal;
   updating an estimated offset correction term based on a digital version of the chopped differential analog signal and an error term representing the offset error caused by the chopping;
   generating an offset-corrected chopped digital output based on the estimated offset correction term and the digital version of the chopped differential analog signal; and
   unchopping the offset-corrected chopped digital output.

8. The method of claim 7, further comprising:
   removing an input-referred offset from the offset-corrected chopped digital output.

9. The method of claim 7, further comprising:
   removing a direct current (DC) offset from the offset-corrected chopped digital output.

10. The method of claim 7, wherein chopping comprises:
    transforming an average of a first offset error associated with the chopping maintaining a same polarity and a second offset error associated with the chopping changing polarity into noise.

11. The method of claim 7, wherein the error term comprises a difference between the digital version of the chopped differential analog signal and a value of the estimated offset correction term.

12. The method of claim 7, wherein updating the estimated offset correction term further based on a convergence coefficient.

13. The method of claim 7, wherein updating the estimated offset correction term comprises:
    subtracting the digital version of the chopped differential analog signal by a value of the estimated offset correction term to generate the error term; and
    multiplying the error term by a convergence coefficient.

14. The method of claim 13, wherein updating the estimated offset correction term further comprises:
    adding a result of the multiplying to the value of the estimated offset correction term to update the estimated offset correction term.

15. The method of claim 7, wherein generating the offset-corrected chopped digital output comprises:
    subtracting the digital version of the chopped differential analog signal by a value of the estimated offset correction term.

16. An apparatus comprising:
    analog means to randomly change a polarity of a differential analog signal and generate a chopped differential analog signal;
    means to quantize the chopped differential analog signal into a chopped digital signal; and
    digital means to:
       update an estimated offset correction term based on chopped digital signal and an error term representing an offset error caused by the analog means;
       generate an offset-corrected chopped digital output based on the estimated offset correction term and the chopped digital signal; and
       unchop the offset-corrected chopped digital output.

17. The apparatus of claim 16, wherein the analog means comprises a random chopper circuit.

18. The apparatus of claim 16, wherein the digital means comprise:
    a first node to subtract the chopped digital signal by a value of the estimated offset correction term to generate the error term; and
    a multiplier to multiply the error term by a convergence coefficient.

19. The apparatus of claim 18, wherein the digital means further comprise:
    a second node to add a result of the multiplier to the value of the estimated offset correction term to update the estimated offset correction term.

20. The apparatus of claim 18, wherein the digital means comprise:
    a node to subtract the chopped digital signal by a value of the estimated offset correction term.

* * * * *